US012727269B2

(12) United States Patent
Park et al.

(10) Patent No.: US 12,727,269 B2
(45) Date of Patent: Sep. 1, 2026

(54) IMAGE SENSOR WITH STACK STRUCTURE AND MANUFACTURING METHOD THEREOF

(71) Applicant: Samsung Electronics Co., Ltd., Suwon-si (KR)

(72) Inventors: Byungjun Park, Suwon-si (KR); Jieun Kim, Suwon-si (KR); Woojae Jang, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 362 days.

(21) Appl. No.: 18/524,723

(22) Filed: Nov. 30, 2023

(65) Prior Publication Data

US 2024/0258347 A1 Aug. 1, 2024

(30) Foreign Application Priority Data

Jan. 27, 2023 (KR) ........................ 10-2023-0011106

(51) Int. Cl.
*H10F 39/00* (2025.01)
*H10F 39/18* (2025.01)

(52) U.S. Cl.
CPC ....... *H10F 39/8057* (2025.01); *H10F 39/182* (2025.01); *H10F 39/8053* (2025.01)

(58) Field of Classification Search
CPC ............... H10F 39/8057; H10F 39/182; H10F 39/8053; H10F 39/807
See application file for complete search history.

(56) References Cited

U.S. PATENT DOCUMENTS

| | | | |
|---|---|---|---|
| 7,180,044 | B2 | 2/2007 | Yu |
| 7,800,192 | B2 | 9/2010 | Venezia et al. |
| 8,558,338 | B2 | 10/2013 | Tsuji |
| 9,059,066 | B2 | 6/2015 | Lee |
| 9,299,740 | B2 | 3/2016 | Tseng et al. |
| 10,319,762 | B2 | 6/2019 | Han |
| 11,211,419 | B2 | 12/2021 | Wu et al. |
| 11,222,917 | B2 | 1/2022 | Han et al. |
| 2011/0062436 | A1 | 3/2011 | Yamazaki et al. |
| 2017/0330905 | A1 | 11/2017 | Tak et al. |
| 2019/0035828 | A1 | 1/2019 | Han |
| 2022/0231065 | A1 | 7/2022 | Chou et al. |

(Continued)

FOREIGN PATENT DOCUMENTS

| | | | |
|---|---|---|---|
| EP | 2245663 | B1 | 2/2012 |
| TW | 201931584 | A | 8/2019 |

*Primary Examiner* — Samuel A Gebremariam
(74) *Attorney, Agent, or Firm* — Harness, Dickey & Pierce, P.L.C.

(57) ABSTRACT

An image sensor may include a first semiconductor chip including a pixel area and a peripheral area, the pixel area including a plurality of pixels, and a second semiconductor chip coupled to a lower surface of the first semiconductor chip, the second semiconductor chip including a plurality of logic elements, the pixel area including a plurality of color filters and a fence in the pixel area, the plurality of color filters corresponding to the plurality of pixels, the fence having a grid pattern, and each of the color filters of the plurality of color filters separated from each other by the fence, the peripheral area including a shield area and a shield outer area, the shield area surrounding the pixel area, and a fence insulating layer included in the shield outer area, the fence insulating layer including a same material as the fence.

20 Claims, 25 Drawing Sheets

(56) References Cited

U.S. PATENT DOCUMENTS

| | | | |
|---|---|---|---|
| 2022/0285412 | A1 | 9/2022 | Liu et al. |
| 2022/0302198 | A1 | 9/2022 | Kang et al. |
| 2022/0328557 | A1 | 10/2022 | Park et al. |

1000
PA
PE1
APS
OB
TVA1
SHA
I/O PAD
C/E
110
105
PD
120
130
142
140
1st chip (100)
2nd chip (200)
z
y
x
212
214
210
152
154
150
182
184
180
160
162
101
170
125

FIG. 5B

I/O PAD
110a
118a
116a
115
112
105
101
150
152
154
NDA
NDA
214
210
212
182
180
184
170
II'
II
1st chip (100)
2nd chip (200)

FIG. 6B

1000d
PA
PE1
APS
OB
TVA1
SHA
I/O PAD
C/E
110a
105
120a
130
142
140
130a
NDA
170
125c
PD
1st chip (100)
2nd chip (200)
212
214
210
152
154
150
182
184
180
101
z
x
y

IMAGE SENSOR WITH STACK STRUCTURE AND MANUFACTURING METHOD THEREOF

CROSS-REFERENCE TO RELATED APPLICATION

This U.S. non-provisional application claims the benefit of priority under 35 U.S.C. § 119 to Korean Patent Application No. 10-2023-0011106, filed on Jan. 27, 2023, in the Korean Intellectual Property Office, the disclosure of which is incorporated by reference herein in its entirety.

BACKGROUND

Various example embodiments of the inventive concepts relate to an image sensor, and more particularly, to an image sensor with a stack structure, in which semiconductor chips are coupled to each other, a system including the image sensor, a method of operating the image sensor, and/or a manufacturing method the image sensor, etc.

In general, image sensors may include pixel areas and logic areas. A plurality of pixels may be arranged in a 2-dimensional array structure in a pixel area, and a unit pixel constituting the pixels may include one photodiode and a plurality of pixel transistors. The pixel transistors may include, for example, a transfer transistor, a reset transistor, a source follower transistor, and a selection transistor. Logic elements for processing pixel signals from the pixel area may be arranged in the logic area. Recently, image sensors with a stack structure have been developed. This stack structure is made by forming the pixel region and the logic region in respective semiconductor chips and then stacking the two semiconductor chips. The image sensors having a stack structure may provide a high-quality and reliable image sensor by increasing and/or maximizing the number of pixels in the pixel area and improving and/or optimizing the performance of logic elements in the logic area.

SUMMARY

Various example embodiments of the inventive concepts provide an image sensor with a stack structure having improved stain defects, a system including the image sensor, a method of operating the image sensor, and/or a manufacturing method the image sensor, etc.

The objects of the example embodiments of the inventive concepts are not limited to the aforementioned object, and other objects not described herein will be clearly understood by those skilled in the art from the following description.

According to at least one example embodiment of the inventive concepts, there is provided an image sensor with a stack structure, the image sensor including a first semiconductor chip including a pixel area and a peripheral area, the pixel area including a plurality of pixels, and a second semiconductor chip coupled to a lower surface of the first semiconductor chip, the second semiconductor chip including a plurality of logic elements, the pixel area including a plurality of color filters and a fence in the pixel area, the plurality of color filters corresponding to the plurality of pixels, the fence having a grid pattern, and each of the color filters of the plurality of color filters separated from each other by the fence, the peripheral area including a shield area and a shield outer area, the shield area surrounding the pixel area, and a fence insulating layer included in the shield outer area, the fence insulating layer including a same material as the fence.

According to at least one example embodiment of the inventive concepts, there is provided an image sensor with a stack structure, the image sensor including a first semiconductor chip including a substrate and at least one wiring layer, the substrate including a pixel area, a peripheral area, and a back-side insulating layer, the at least one wiring layer on a lower surface of the substrate, the pixel area including a plurality of pixels, and the back-side insulating layer on an upper surface of the substrate, a second semiconductor chip coupled to a lower surface of the first semiconductor chip, the second semiconductor chip including a plurality of logic elements, the back-side insulating layer including a fence, a plurality of color filters, and a $TiO_2$ layer, the fence and the plurality of color filters in the pixel area, the fence including a single insulating layer having a grid pattern, and each color filter of the plurality of color filters separated from each other by the fence, and a fence insulating layer on an I/O pad area and at least one through-via array area of the peripheral area, the fence insulating layer comprising a same material as the fence.

According to at least one example embodiment of the inventive concepts, there is provided an image sensor with a stack structure, the image sensor including a first semiconductor chip including a substrate and a wiring layer, the substrate including a pixel area, a peripheral area, and a back-side insulating layer, the wiring layer on a lower surface of the substrate, the pixel area including a plurality of pixels, and the back-side insulating layer on an upper surface of the substrate, and a second semiconductor chip coupled to a lower surface of the first semiconductor chip, the second semiconductor chip including a plurality of logic elements, the back-side insulating layer including a fence and a plurality of color filters in the pixel area, the fence having a grid pattern and the plurality of color filters separated from each other by the fence, the peripheral area comprising a shield area and a shield outer area, the shield area surrounding the pixel area, and a fence insulating layer in the shield outer area, the fence insulating layer comprising a same material as the fence.

According to at least one example embodiment of the inventive concepts, there is provided a method of manufacturing an image sensor with a stack structure, the method including forming a plurality of pixels in a first substrate of a first semiconductor chip, each of the plurality of pixels including a photodiode, forming a first wiring layer on an active surface of the first substrate, forming a plurality of logic elements in a second substrate of a second semiconductor chip, forming a second wiring layer on an active surface of the second substrate, coupling the first semiconductor chip and the second semiconductor chip to each other so that the first wiring layer faces the second wiring layer, thinning the first substrate, the thinning including removing a portion of a non-active surface of the first substrate, forming a back-side insulating layer on the non-active surface of the first substrate, forming a plurality of through-vias in at least one through-via array area of the first substrate, forming a plurality of color filters on the back-side insulating layer in a pixel area of the first substrate, the plurality of color filters corresponding to the plurality of pixels, forming a plurality of micro lenses on the plurality of color filters, wherein the forming of the color filters includes, forming a fence material layer on the back-side insulating layer, forming a fence having a grid pattern in the pixel area, forming a fence insulating layer in a shield outer area, the shield outer area being outside a shield area of the first substrate, and forming the plurality of color filters inside the fence.

BRIEF DESCRIPTION OF THE DRAWINGS

Various example embodiments will be more clearly understood from the following detailed description taken in conjunction with the accompanying drawings in which:

FIGS. 5A to 7B are plan views of node separation portions, to which a structure of a back-side insulating layer of FIG. 4C is applied, and cross-sections corresponding thereto, according to some example embodiments;

DETAILED DESCRIPTION

Figure 1:
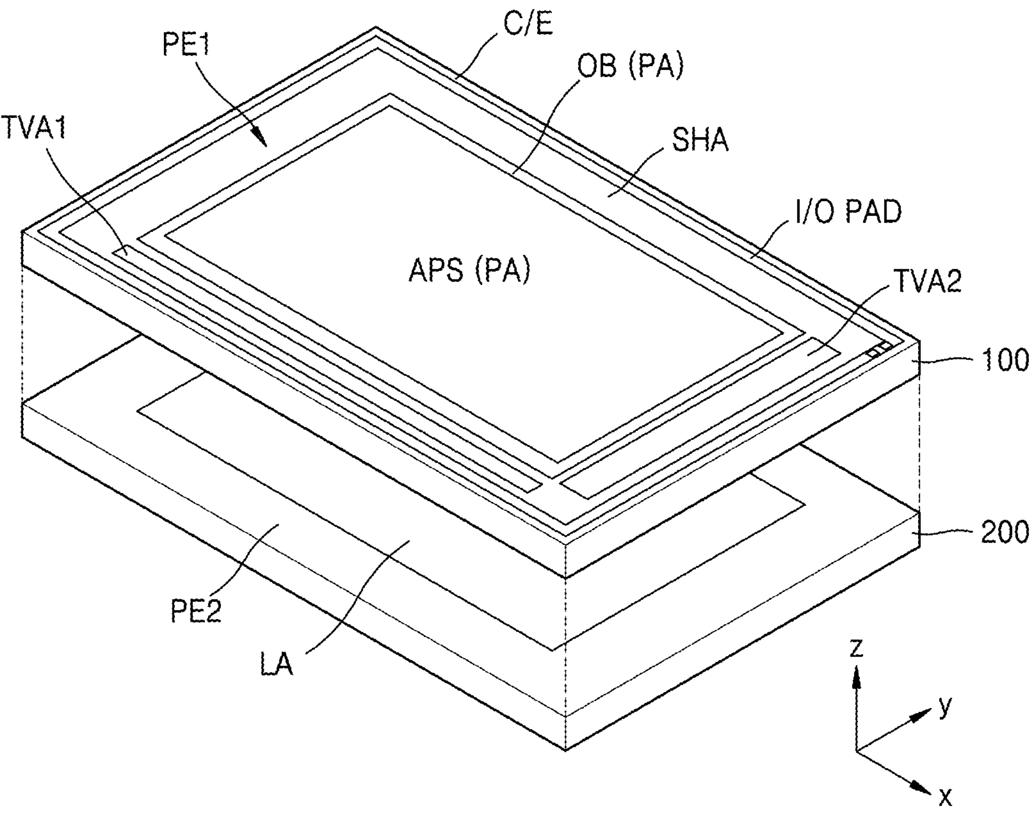
FIG. 1 is a perspective view of an image sensor with a stack structure according to at least one example embodiment and shows an exploded perspective view in which a first semiconductor chip and a semiconductor chip are separated from each other.

Hereinafter, various example embodiments are described in detail with reference to the accompanying drawings. The same reference numerals are used for the same elements in the drawings, and redundant description thereof will be omitted.

FIG. 1 is a perspective view of an image sensor with a stack structure according to at least one example embodiment and shows an exploded perspective view in which a first semiconductor chip and a semiconductor chip are separated from each other, however the example embodiments are not limited thereto.

Referring to FIG. 1, an image sensor 1000 with a stack structure (hereinafter, simply referred to as an "image sensor") according to at least one example embodiment may include a first semiconductor chip 100 and a second semiconductor chip 200. The image sensor 1000 according to at least one example embodiment may have a structure in which the first semiconductor chip 100 is stacked on the second semiconductor chip 200, but the example embodiments are not limited thereto, and for example, the image sensor 1000 may include more than two semiconductor chips and/or additional stack structures, etc. The image sensor 1000 according to at least one example embodiment may include, for example, a complementary metal-oxide semiconductor (CMOS) image Sensor (CIS), but is not limited thereto.

The first semiconductor chip 100 may include a pixel area PA and/or a first peripheral area PE1, etc., but is not limited thereto. The pixel area PA is located at a central region of the first semiconductor chip 100, and the pixel area PA may include a plurality of pixels arranged in a 2-dimensional array structure, etc. The pixel area PA may include an active pixel sensor area APS at the center of the pixel area PA and/or an optical black pixel area OB surrounding the active pixel sensor area APS, but is not limited thereto. Pixels are also arranged in the optical black pixel area OB, but may be dummy pixels that are not electrically operated. In addition, a first metal layer 140 (see FIG. 3A) may be located in an upper portion of the optical black pixel area OB so as to decrease, block, and/or shield light from reaching the optical black pixel area OB, etc.

The first peripheral area PE1 may include a shield area SHA, an I/O pad area I/O PAD, and/or a chip edge area C/E, etc., but the example embodiments are not limited thereto. The shield area SHA may be located outside the optical black pixel area OB. A second metal layer 160 (see FIG. 3A) and/or a fence insulating layer 125*a* (see FIG. 3B) may be located in at least a portion of the shield area SHA so as to decrease, block, and/or shield light, etc. In addition, a first through-via array area TVA1 and/or a second through-via array area TVA2 may be located in a portion of the shield area SHA. A plurality of through-vias 150 (see FIG. 3A) may be arranged in the first through-via array area TVA1 and the second through-via array area TVA2, etc., but the example embodiments are not limited thereto.

The first through-via array area TVA1 may extend in an x-direction as shown in FIG. 1 (e.g., a first direction with respect to the surface of the image sensor 1000) and be located on the bottom side in a y-direction (e.g., a second surface with respect to the surface of the image sensor 1000), and the second through-via array area TVA2 may extend in the y-direction and be located on the right side of the x-direction. However, the shapes and locations of the first through-via array area TVA1 and the second through-via array area TVA2 are not limited to the shapes and locations described above. Furthermore, in the image sensor 1000 according to at least one example embodiment, the number of through-via array areas is not limited to two, and three or four, etc., through-via array areas may be arranged. Also, according to at least one example embodiment, the first through-via array area TVA1 and the second through-via array area TVA2 may be regarded as separate areas from the shield area SHA.

In addition, the plurality of through-vias 150 may be connected to the pixels of the active pixel sensor area APS via a plurality of first lines 182 (see FIG. 3A) of a first wiring layer 180 (see FIG. 3A) of the first semiconductor chip 100, but the example embodiments are not limited thereto. Also, the plurality of through-vias 150 may connect the first lines 182 of the first wiring layer 180 of the first semiconductor chip 100 to a plurality of second lines 212 (see FIG. 3A) of a second wiring layer 210 (see FIG. 3A) of the second semiconductor chip 200, but are not limited thereto. The second lines 212 of the second wiring layer 210 of the second semiconductor chip 200 may be connected to one or more logic elements of a logic area LA, etc. For example, the through-vias 150 of the first through-via array area TVA1 may be connected to a correlated double sampling (CDS) circuit of the logic area LA, and the through-vias 150 of the second through-via array area TVA2 may be connected to a row driver circuit of the logic area LA, but the example embodiments are not limited thereto. A detailed structure of the through-vias 150 according to some example embodiments are described in more detail in the description of FIGS. 3A and 3B.

The chip edge area C/E may surround the shield area SHA and occupy an outermost portion of the first semiconductor chip 100. According to at least one example embodiment, a portion of a scribe lane (S/L) may remain adjacent to the chip edge area C/E. For reference, in an image sensor according to the related art, a metal layer exists in a chip edge area C/E. However, in the image sensor 1000 according to at least one example embodiment, a metal layer may not exist in the chip edge area C/E, etc.

Figure 2:
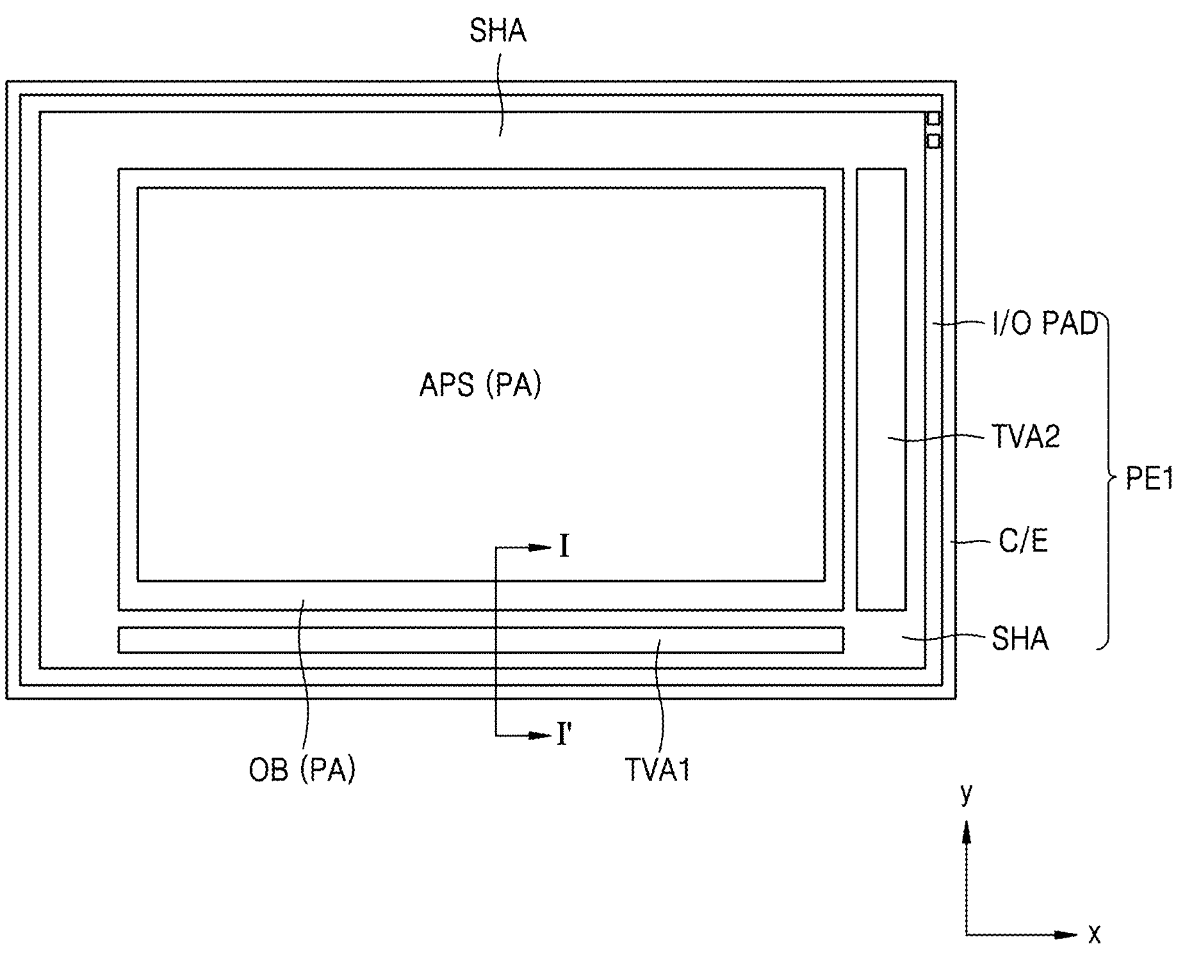
FIG. 2 is a plan view of the image sensor of the stack structure of FIG. 1 according to some example embodiments.
Figure 3A:
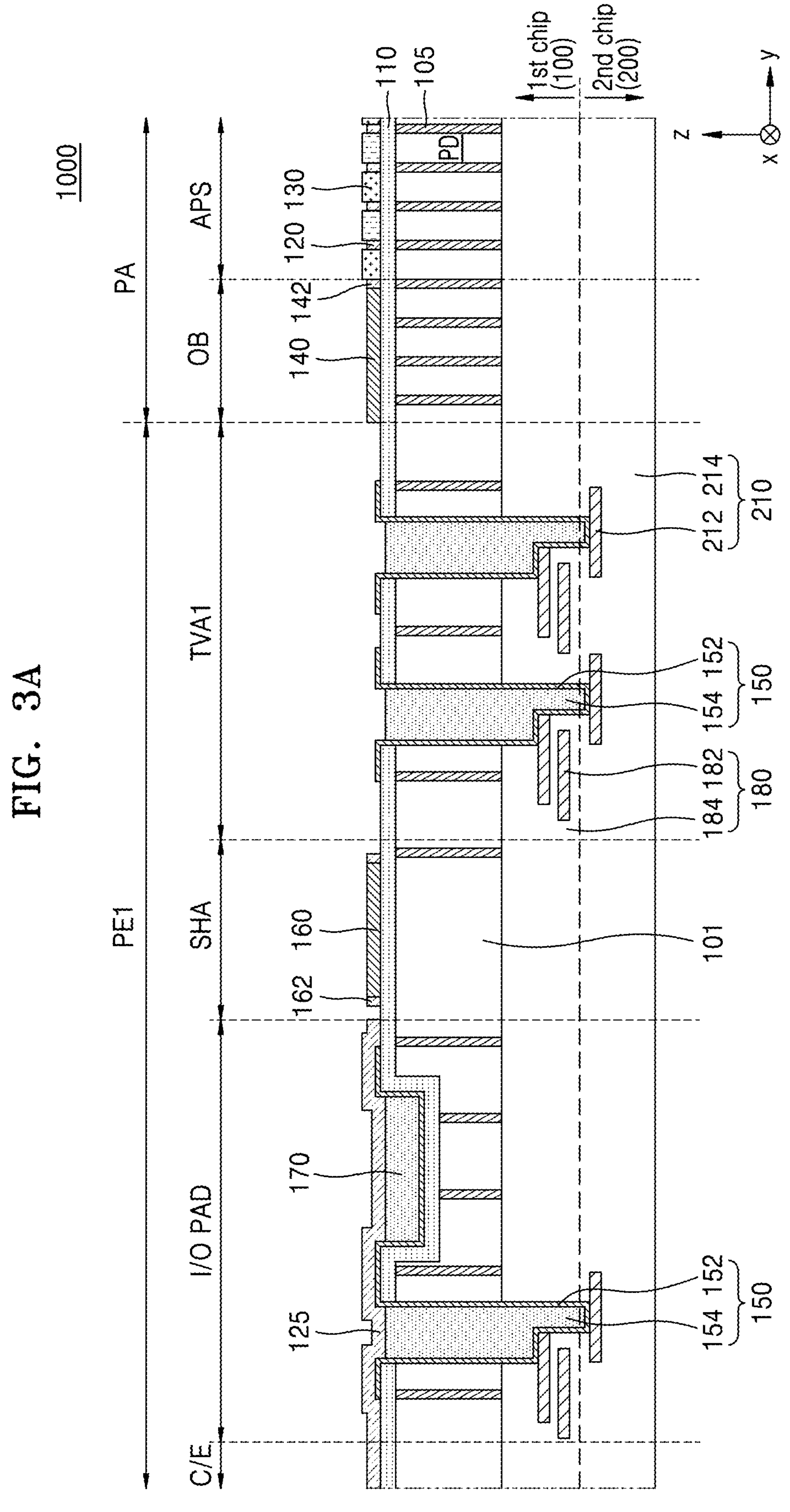
FIG. 3A is a cross-sectional view taken along line I-I' of FIG. 2.
Figure 3B:
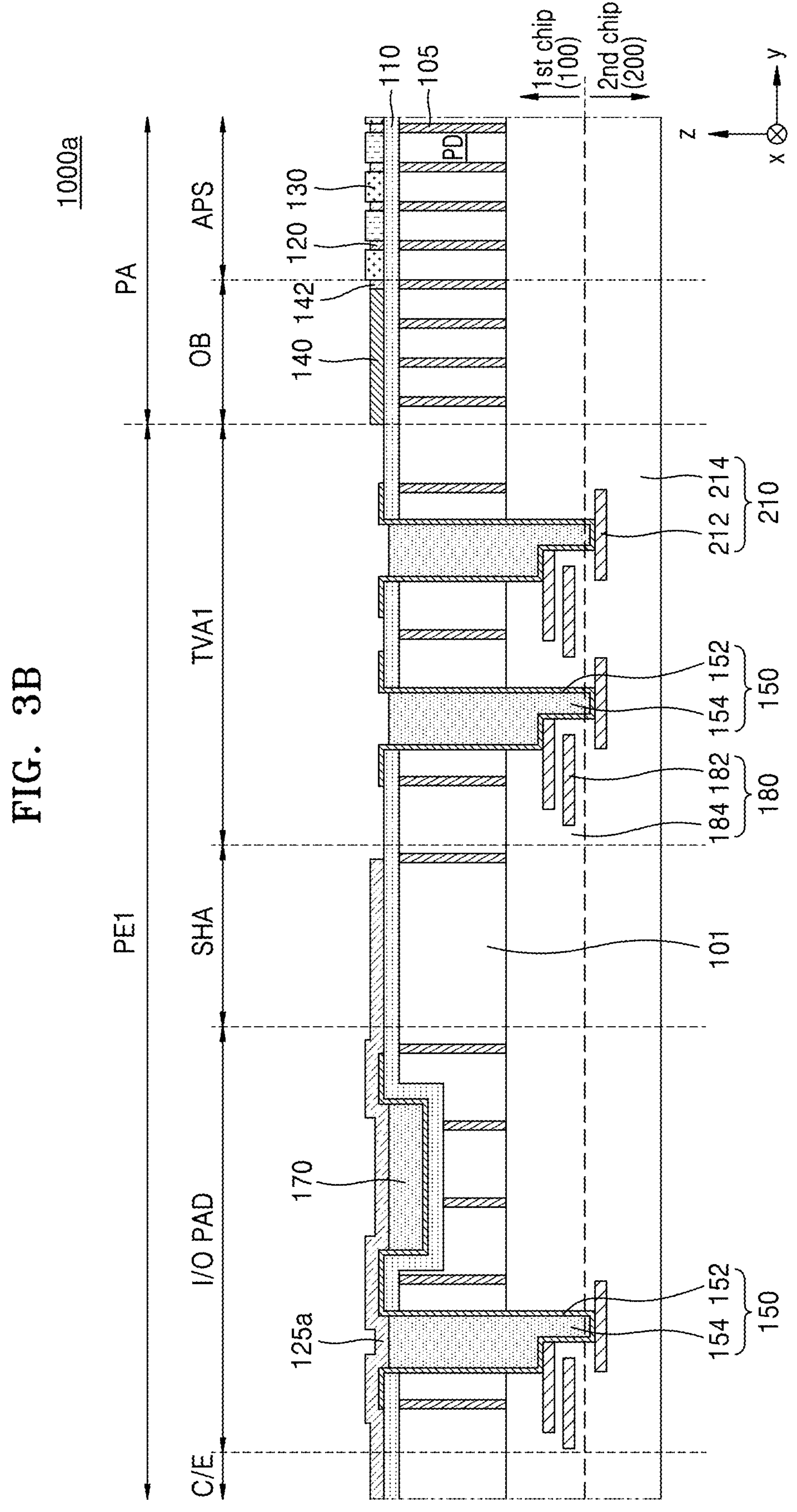
FIG. 3B is a cross-sectional view of an image sensor according to at least one example embodiment.

FIG. 2 is a plan view of the image sensor 1000 with the stack structure of FIG. 1. FIG. 3A is a cross-sectional view taken along line I-I' of FIG. 2, and FIG. 3B is a cross-sectional view of an image sensor according to at least one example embodiment and corresponds to FIG. 3A, however the example embodiments are not limited thereto. A description is given below with reference to FIG. 1 together, and descriptions already given with reference to FIG. 1 are briefly given or omitted.

Referring to FIGS. 2 and 3A, when the image sensor 1000 according to at least one example embodiment is viewed as a vertical structure in a z-direction (e.g., a third direction in relation to a surface of the image sensor 1000), a first substrate 101 may be positioned in an upper portion of the first semiconductor chip 100, and the first wiring layer 180 may be positioned in a lower portion of the first semiconductor chip 100, but are not limited thereto. The first substrate 101 may include silicon (Si). However, the material of the first substrate 101 is not limited to Si. For example, the first substrate 101 may include a single element semiconductor, such as germanium (Ge), or a compound semiconductor, such as silicon carbide (SiC), gallium arsenide (GaAs), indium arsenide (InAs), and/or indium phosphide (InP), etc. A plurality of pixels may be formed in the pixel area PA of the first substrate 101, etc. The pixels arranged in first substrate 101 each may include a photodiode PD and may be separated from each other by at least one deep trench isolation (DTI) 105, but are not limited thereto.

The first wiring layer 180 may be located below the first substrate 101 and include the plurality of first lines 182 and a first interlayer insulating layer 184, but is not limited thereto. The first lines 182 in another layer (e.g., a second layer, etc.) may be connected to each other via vertical contacts, but are not limited thereto. Although FIG. 3A illustrates the first lines 182 in two layers, the number of layers of the first lines 182 is not limited to two. In addition, although the first lines 182 are illustrated only in the first peripheral area PE1 in FIG. 3A, the first lines 182 may also be arranged in the pixel area PA, and/or the first lines 182 in the first peripheral area PE1 may be connected to the first lines 182 in the pixel area PA, etc. The first lines 182 in the pixel area PA may be respectively connected to pixel transistors.

A back-side insulating layer 110 may be on a back side of the first substrate 101. The back-side insulating layer 110 may include at least two material layers, etc. For example, the back-side insulating layer 110 may include four material layers, and the uppermost layer may act as an etch stop layer for a metal layer and/or a fence film, but are not limited thereto. Also, the structure of the back-side insulating layer 110 may vary depending on the structures of a fence 120 and/or a fence insulating layer 125 on the back-side insulating layer 110, etc. A detailed structure of the back-side insulating layer 110 according to some example embodiments are described in more detail in the description of FIGS. 4A to 4C.

A plurality of color filters 130 and/or a plurality of micro lenses may be arranged on the back-side insulating layer 110 in the active pixel sensor area APS, but the example embodiments are not limited thereto. In the active pixel sensor area APS of FIG. 3A, the micro lenses are omitted, and only color filters 130 and fences 120 separating the color filters 130 from each other are illustrated, however the example embodiments are not limited thereto. The fences 120 may be connected to each other in a 2-dimensional grid pattern, but are not limited thereto. The fence 120 may include, for example, tetraethyl orthosilicate (TEOS), etc. The TEOS may be formed below 400° C. using a plasma process, but is not limited thereto. The TEOS formed through the plasma process as described above is referred to as plasma-enhanced tetraethyl orthosilicate (PE-TEOS) or plasma tetraethyl orthosilicate (PTEOS).

For reference, a structure and/or image sensor, in which the color filters 130 and/or the micro lenses are arranged on the opposite side from the first wiring layer 180 with respect to the first substrate 101 in which the pixels are formed, is referred to as a back side illumination (BSI) structure or BSI image sensor. On the other hand, a structure and/or image sensor, in which the color filters and/or the micro lenses are arranged on the same side as the first wiring layer 180 with respect to the first substrate 101, that is, a structure and/or image sensor, in which the color filters and/or the micro lenses are arranged on the first wiring layer 180, is referred to as a front side illumination (FSI) structure or FSI image sensor. In the image sensor 1000 according to at least one example embodiment, the first semiconductor chip 100 may have a BSI structure, but is not limited thereto. Accordingly, the image sensor 1000 according to at least one example embodiment may include a BSI image sensor, etc.

On the back-side insulating layer 110 in the optical black pixel area OB and the first peripheral area PE1, patterns and/or components may be arranged according to the respective corresponding areas. More specifically, a first metal layer 140 may be on the back-side insulating layer 110 in the optical black pixel area OB, but is not limited thereto. A first spacer 142 may be located on at least one side surface of the first metal layer 140, but is not limited thereto. According to at least one example embodiment, the first spacer 142 may be omitted.

The through-vias 150 passing through the back-side insulating layer 110 and the first substrate 101 may be arranged in the first through-via array area TVA1. The through-vias 150 pass through the first substrate 101 of Si and may thus correspond to through-silicon vias (TSV), but are not limited thereto. Each of the through-vias 150 may include an outer conductive layer 152 and a via metal layer 154, etc. The outer conductive layer 152 may include at least one metal layer. For example, the outer conductive layer 152 may include titanium (Ti)/titanium nitride (TiN) and/or tungsten (W), etc., and/or the via metal layer 154 may include aluminum (Al), etc. However, the materials of the outer conductive layer 152 and the via metal layer 154 are not limited to the above materials.

The through-vias 150 may be connected to the first lines 182 of the first wiring layer 180 and may also be connected to the second lines 212 of the second wiring layer 210 of the second semiconductor chip 200, but the example embodiments are not limited thereto. That is, the through-vias 150 may connect the first lines 182 and the second lines 212 to each other, etc.

A second metal layer 160 may be on the back-side insulating layer 110 in the shield area SHA. A second spacer 162 may be located on at least one side surface of the second metal layer 160. According to at least one example embodiment, the second spacer 162 may be omitted. As described above, the first through-via array area TVA1 and the second through-via array area TVA2 may be arranged in the shield area SHA. According to at least one example embodiment, the first through-via array area TVA1 and the second through-via array area TVA2 may be regarded as a portion of the shield area SHA. However, in the image sensor 1000 according to at least one example embodiment, these regions are distinguished from each other and illustrated as separate regions for convenience of description and for the sake of clarity.

The through-vias 150 and at least one pad 170 may be arranged in the I/O pad area I/O PAD. The through-vias 150 in the I/O pad area I/O PAD may be the same and/or substantially the same as the through-vias 150 in the first through-via array area TVA1, but are not limited thereto. Accordingly, the through-vias 150 may be connected to the first lines 182 of the first wiring layer 180 and may also be connected to the second lines 212 of the second wiring layer 210 of the second semiconductor chip 200, etc. Also, in the I/O pad area I/O PAD, the through-vias 150 may be connected to the pad 170 via the outer conductive layer 152. That is, in the I/O pad area I/O PAD, the through-vias 150 may connect the pad 170 to the first lines 182 and/or the second lines 212, but are not limited thereto.

Meanwhile, according to at least one example embodiment, at least one dummy pad area may be located between the I/O pad area I/O PAD and the shield area SHA. At least one dummy pad may be located in the dummy pad area. However, the dummy pad may not operate electrically (e.g., the dummy pad may not be operational and/or the dummy pad may not be electrically connected to a power source and/or ground, etc.). No other component may be arranged in the chip edge area C/E. Also, although not illustrated, the S/L may remain adjacent to the chip edge area C/E.

As illustrated in FIG. 3A, the I/O pad area I/O PAD and/or the chip edge area C/E may be covered by the fence insulating layer 125, but the example embodiments are not limited thereto. Specifically, in the I/O pad area I/O PAD, the fence insulating layer 125 may cover a region above the through-via 150, an extension portion of the outer conductive layer 152, and/or an exposed back-side insulating layer 110, etc.

In the chip edge area C/E, the fence insulating layer 125 may cover the back-side insulating layer 110. In other words, in the image sensor 1000 according to at least one example embodiment, the chip edge area C/E has no separate metal layer, and thus, the fence insulating layer 125 may directly cover the back-side insulating layer 110. In addition, when the S/L remains adjacent to the chip edge area C/E, the fence insulating layer 125 may cover the back-side insulating layer 110 on the S/L.

The fence insulating layer 125 may include the same and/or substantially the same material as the fence 120 of the active pixel sensor area APS. For example, the fence insulating layer 125 may include TEOS or PTEOS, but is not limited thereto. In addition, the fence insulating layer 125 may have the same and/or substantially the same thickness (e.g., within +/−10%) as the fence 120, but is not limited thereto. For example, each of the fence insulating layer 125 and the fence 120 may have a thickness of about 3400 Å, etc. However, the thicknesses of the fence insulating layer 125 and the fence 120 are not limited to the above values. According to at least one example embodiment, the fence insulating layer 125 and the fence 120 are formed together by patterning the same material layer and thus have the same thickness. A method of forming the fence insulating layer 125 and the fence 120 is described below in more detail in the description of FIGS. 10A to 10C.

In the image sensor 1000 according to at least one example embodiment, the fence insulating layer 125 is maintained on the back-side insulating layer 110 in regions outside the shield area SHA, for example, in regions of the I/O pad area I/O PAD and the chip edge area C/E, and thus, stain defects may be significantly improved (e.g., stain defects may be significantly reduced, decreased, etc.). If a portion of the S/L remains adjacent to the chip edge area C/E, the fence insulating layer 125 may also be maintained on the back-side insulating layer 110 of the S/L. In general, each of the color filters 130 on the back side of the BSI image sensor may be formed through a spin coating process, but is not limited thereto. However, during the spin coating process for the color filter 130, when there is a large difference and/or a relatively large difference in height between patterns (e.g., difference in length in the z-direction, etc.) on the back side of the BSI image sensor, stain defects may occur due to the spin coating solution used in the spin coating process leaking onto and/or covering other portions of the image sensor, thereby causing stain defects in the images captured by the image sensor 1000. However, in the image sensor 1000 according to at least one example embodiment, the fence insulating layer 125 is maintained on the outside of the shield area SHA, and thus, the differences in height between the patterns on the back side of the image sensor 1000 may be decreased and/or minimized. Accordingly, stain defects may be significantly improved (e.g., the occurrence of stain defects may be significantly decreased, etc.). In addition, the fence insulating layer 125 may replace a metal layer on the outside of the shield area SHA, and thus, the density of the metal layer may be lowered to reduce warpage of a wafer and/or chip, etc.

In addition, each of the fence 120 and the fence insulating layer 125 may include a lower conductive layer 122 (see FIG. 4A) and/or an upper insulating layer 124 (see FIG. 4A), but are not limited thereto. However, in some example embodiments, a fence 120*a* (see FIG. 4B) and the fence insulating layer 125 may include a single insulating layer without a conductive layer. Depending on whether the fence and the fence insulating layer include the lower conductive layer, the structure of the back-side insulating layer may vary. This is described in more detail in the description of FIGS. 4A to 4C.

As can be seen in FIG. 1, the second semiconductor chip 200 may include a logic area LA and/or a second peripheral area PE2, etc. The logic area LA is located at a central region of the second semiconductor chip 200, and a plurality of logic elements may be arranged in the logic area LA. The logic elements may include various elements and/or components for processing pixel signals output by the pixels of the first semiconductor chip 100. For example, the logic elements may include an analog signal processing element, an analog-to-digital converter (ADC), an image signal processing element, a control element, and the like. However, elements included in the logic area LA are not limited thereto. For example, elements for supplying power and/or ground to pixels and/or passive elements, such as resistors, capacitors, etc., may be arranged in the logic area LA, but the example embodiments are not limited thereto.

The second peripheral area PE2 has a structure surrounding the logic area LA and may be located outside the logic area LA. For example, the second peripheral area PE2 has a shape surrounding four side surfaces of the logic area LA and is located outside the logic area LA. However, according to at least one example embodiment, the second peripheral area PE2 may be located on the outside of only some sides (e.g., at least one side) of the logic area LA. Also, although not specifically illustrated, one or more through-via array areas may also be arranged in the second peripheral area PE2, corresponding to the first and second through-via array areas TVA1 and TVA2 of the first semiconductor chip 100, but the example embodiments are not limited thereto.

As illustrated in FIG. 3A, when viewed as a vertical structure in the z-direction, a second substrate 201 (see FIG. 9B) may be positioned in a lower portion of the second semiconductor chip 200, and the second wiring layer 210 may be positioned in an upper portion of the second semiconductor chip 200, but the example embodiments are not limited thereto. The second substrate 201 may also include Si, etc. However, the material of the second substrate 201 is not limited to Si. The one or more logic elements may be arranged in the second substrate 201, but is not limited thereto.

The second wiring layer 210 may be located above the second substrate 201 and include the plurality of second lines 212 and/or a second interlayer insulating layer 214, etc. In FIG. 3A, a second line 212 of a single layer is illustrated for sake of clarity and convenience of description. However, the second wiring layer 210 may include a plurality of second lines 212 in multiple layers. The second lines 212 of the second wiring layer 210 may be connected to the one or more logic elements of the logic area LA. Also, the second lines 212 of the second wiring layer 210 may be connected to the first lines 182 of the first wiring layer 180 and/or the pad 170 via the through-via 150, etc.

As illustrated in FIG. 1, the second semiconductor chip 200 may be under the first semiconductor chip 100 and coupled to the first semiconductor chip 100 through, for example, direct bonding, but is not limited thereto. Here, the direct bonding may mean that an insulating layer of the first semiconductor chip 100 and an insulating layer of the second semiconductor chip 200 are directly coupled (e.g., bonded) to each other. According to at least one example embodiment, the first semiconductor chip 100 and the second semiconductor chip 200 may be coupled to each other by a separate adhesive layer, etc.

In the coupled structure of the first semiconductor chip 100 and the second semiconductor chip 200, these semiconductor chips are coupled to each other such that the lower surface of the first wiring layer 180 of the first semiconductor chip 100 faces the upper surface of the second wiring layer 210 of the second semiconductor chip 200. Also, the through-vias 150 are arranged in the through-via array areas of the first and second peripheral areas PE1 and PE2, and the first semiconductor chip 100 and the second semiconductor chip 200 may be electrically connected to each other via the through-vias 150. Accordingly, the plurality of pixel signals from the pixel area PA of the first semiconductor chip 100 may be transmitted to the one or more logic elements of the logic area LA of the second semiconductor chip 200, etc. In addition, driving signals and power/ground signals may be transmitted from the logic elements of the logic area LA of the second semiconductor chip 200 to the pixels of the pixel area PA of the first semiconductor chip 100, etc.

In the image sensor 1000 according to at least one example embodiment, the fence insulating layer 125 is maintained on the back-side insulating layer 110 in regions outside the shield area SHA, for example, in regions of the I/O pad area I/O PAD and the chip edge area C/E, and thus, stain defects may be significantly improved (e.g., significantly decreased, reduced, etc.). In addition, in the image sensor 1000 according to at least one example embodiment, a metal layer on the outside of the shield area SHA may be replaced with the fence insulating layer 125, and thus, the density of the metal layer may be lowered to reduce warpage of a wafer and/or chip, etc.

Referring to FIGS. 2 and 3B, an image sensor **1000*a* according to at least one example embodiment may be different from the image sensor 1000 of FIG. 3A in that a separate metal layer is not on a back-side insulating layer 110 of a shield area SHA of a first peripheral area PE1. Specifically, the image sensor 1000*a* according to at least one example embodiment may include a fence insulating layer 125*a* on the back-side insulating layer 110 of the shield area SHA, but is not limited thereto. The fence insulating layer 125*a* may extend from the shield area SHA to an I/O pad area I/O PAD and a chip edge area C/E, etc. The fence insulating layer 125*a* in the I/O pad area I/O PAD and the chip edge area C/E has the same structure as that of the fence insulating layer 125 in the image sensor 1000 of FIG. 3A, but the example embodiments are not limited thereto. In addition, when a scribe lane (S/L) remains adjacent to the chip edge area C/E, the fence insulating layer 125*a* may also extend on the back-side insulating layer 110** of the S/L.

In the image sensor **1000*a* according to at least one example embodiment, the fence insulating layer 125*a* is maintained even on the back-side insulating layer 110 of the shield area SHA together with the I/O pad area I/O PAD and the chip edge area C/E, and thus, stain defects may be significantly improved (e.g., significantly decreased, reduced, etc.). Also, in the image sensor 1000*a* according to at least one example embodiment, the fence insulating layer 125*a* may replace the second metal layer 160** of the shield area SHA. Therefore, the density of the metal layer may be lowered to reduce warpage of a wafer and/or chip, etc.

Figure 4A:
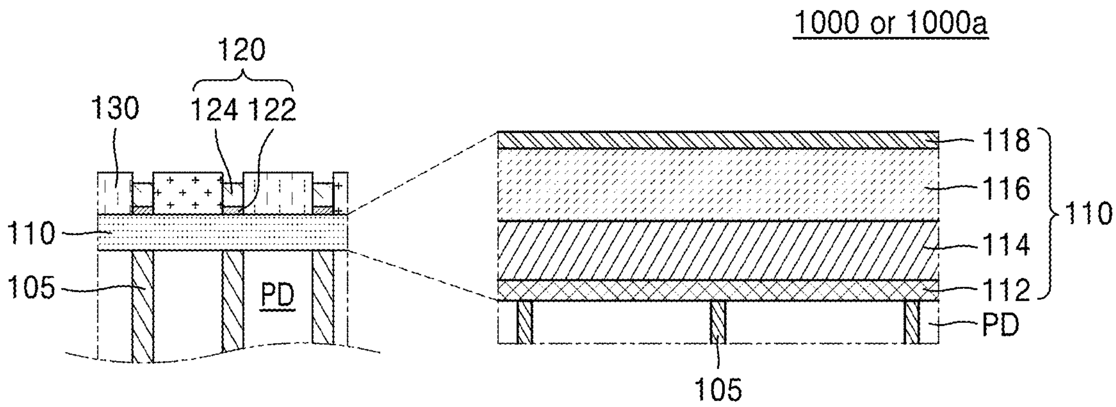
FIGS. 4A to 4C are enlarged cross-sectional views of a back-side insulating layer of FIG. 3A according to some example embodiments.
Figure 4B:
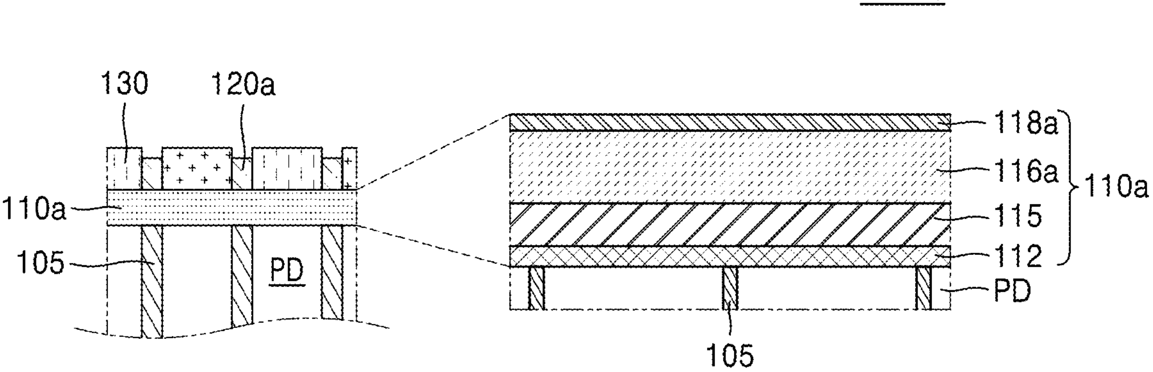
Figure 4C:
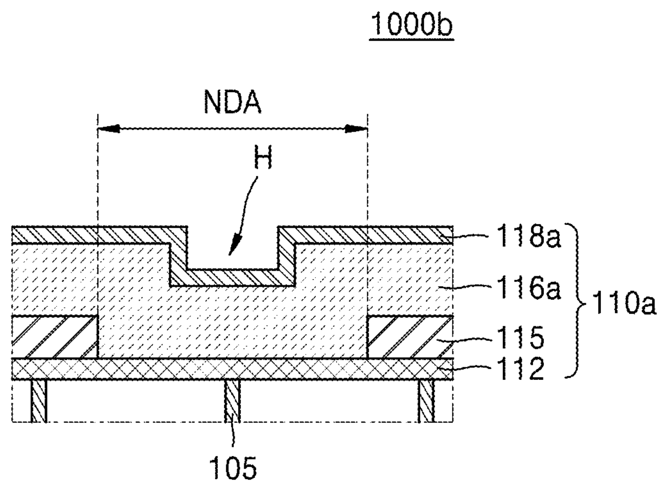

FIGS. 4A to 4C are enlarged cross-sectional views of a back-side insulating layer 110 of FIG. 3A according to some example embodiments. A description is given below with reference to FIG. 3A together, and descriptions already given with reference to FIGS. 1 to 3B are briefly given or omitted.

Referring to FIG. 4A, in the image sensor 1000 according to at least one example embodiment, the fence 120 of the active pixel sensor area APS may include a lower conductive layer 122 and/or an upper insulating layer 124, but is not limited thereto. Also, like the fence 120, the fence insulating layer 125 of the first peripheral area PE1 may also include the lower conductive layer 122 and/or the upper insulating layer 124, etc. The lower conductive layer 122 may include, for example, Ti/TiN, and the upper insulating layer 124 may include, for example, TEOS and/or PTEOS. However, the materials of the lower conductive layer 122 and the upper insulating layer 124 are not limited to the above materials. In addition, the double layer structure of each of the fence 120 and the fence insulating layer 125 may also be applied to the image sensor **1000*a* of FIG. 3**B, but the example embodiments are not limited thereto.

When each of the fence 120 and the fence insulating layer 125 includes the lower conductive layer 122, the back-side insulating layer 110 may include an AlO layer 112, a first HfOx layer 114, a PTEOS layer 116, and/or a second HfOx layer 118, etc., which are sequentially stacked on the back side of the first substrate 101, but the example embodiments are not limited thereto. The AlO layer 112, the first HfOx layer 114, the PTEOS layer 116, and the second HfOx layer 118 may have thicknesses of, for example, 100 Å, 625 Å, 700 Å, and 100 Å, respectively. However, the thicknesses of the AlO layer 112, the first HfOx layer 114, the PTEOS layer 116, and the second HfOx layer 118 are not limited to the above values. Also, the second HfOx layer 118 may act as an etch stop layer for an upper metal layer and/or an upper fence film.

Referring to FIGS. 4B and 4C, in an image sensor 1000*b* according to at least one example embodiment, a fence 120*a* of an active pixel sensor area APS may include a single insulating layer, but the example embodiments are not limited thereto. That is, the fence 120*a* may not include a lower conductive layer. Also, the image sensor 1000*b* according to at least one example embodiment may include the fence insulating layer 125 of FIG. 3A or the fence insulating layer 125*a* of FIG. 3B in a first peripheral area PE1, but is not limited thereto. Like the fence 120*a*, the fence insulating layer 125 or 125*a* may include a single insulation layer, but is not limited thereto. The fence 120*a* and the fence insulating layer 125 or 125*a* may include, for example, TEOS and/or PTEOS, etc. However, the materials of the fence 120*a* and the fence insulating layer 125 or 125*a* are not limited to the above materials.

When each of the fence 120*a* and the fence insulating layer 125 or 125*a* includes a single insulating layer, a back-side insulating layer 110*a* may include an AlO layer 112, a $TiO_2$ layer 115, a PTEOS layer 116*a*, and/or an HfOx layer 118*a*, etc., which are sequentially stacked on the back side of the first substrate 101, but is not limited thereto. The AlO layer 112, the $TiO_2$ layer 115, the PTEOS layer 116*a*, and the HfOx layer 118*a* may have thicknesses of, for example, 100 Å, 360 Å, 700 Å, and 100 Å, respectively, but the example embodiments are not limited thereto. However, the thicknesses of the AlO layer 112, the $TiO_2$ layer 115, the PTEOS layer 116*a*, and the HfOx layer 118*a* are not limited to the above values. Also, the HfOx layer 118*a* may act as an etch stop layer for an upper metal layer and/or an upper fence film. In addition, the $TiO_2$ layer 115 may act as a reflection-preventing layer as a conductive film, etc.

In the image sensor 1000*b* according to at least one example embodiment, each of the fence 120*a* and the fence insulating layer 125 or 125*a* does not include a lower conductive layer, and the back-side insulating layer 110*a* may include the $TiO_2$ layer 115 instead of the first HfOx layer 114, but is not limited thereto. Also, as the $TiO_2$ layer 115 has a thickness of about 360 Å, the total thickness of the back-side insulating layer 110*a* may be reduced by about 265 Å compared to the back-side insulating layer 110 of FIG. 4A, but the example embodiments are not limited thereto.

In addition, as the back-side insulating layer 110*a* includes the $TiO_2$ layer 115 having conductivity, the $TiO_2$ layer 115 may be disconnected at a portion in which node separation is desired and/or required. FIG. 4C shows a structure in which the $TiO_2$ layer 115 is disconnected at a node separation portion NDA. As the $TiO_2$ layer 115 is disconnected in the node separation portion NDA, a groove H may be formed in the node separation portion NDA. In other words, as illustrated in FIG. 4C, in the node separation portion NDA in which the $TiO_2$ layer 115 is disconnected, the PTEOS layer 116*a* and the HfOx layer 118*a* in an upper region are formed to a uniform thickness or substantially uniform thickness (e.g., +/−10% thickness), and thus, the groove H may be formed in the node separation portion NDA, etc. Hereinafter, FIGS. 5A to 7B show various node separation portions NDA in which the $TiO_2$ layer 115 is disconnected, but the example embodiments are not limited thereto.

Figure 5A:
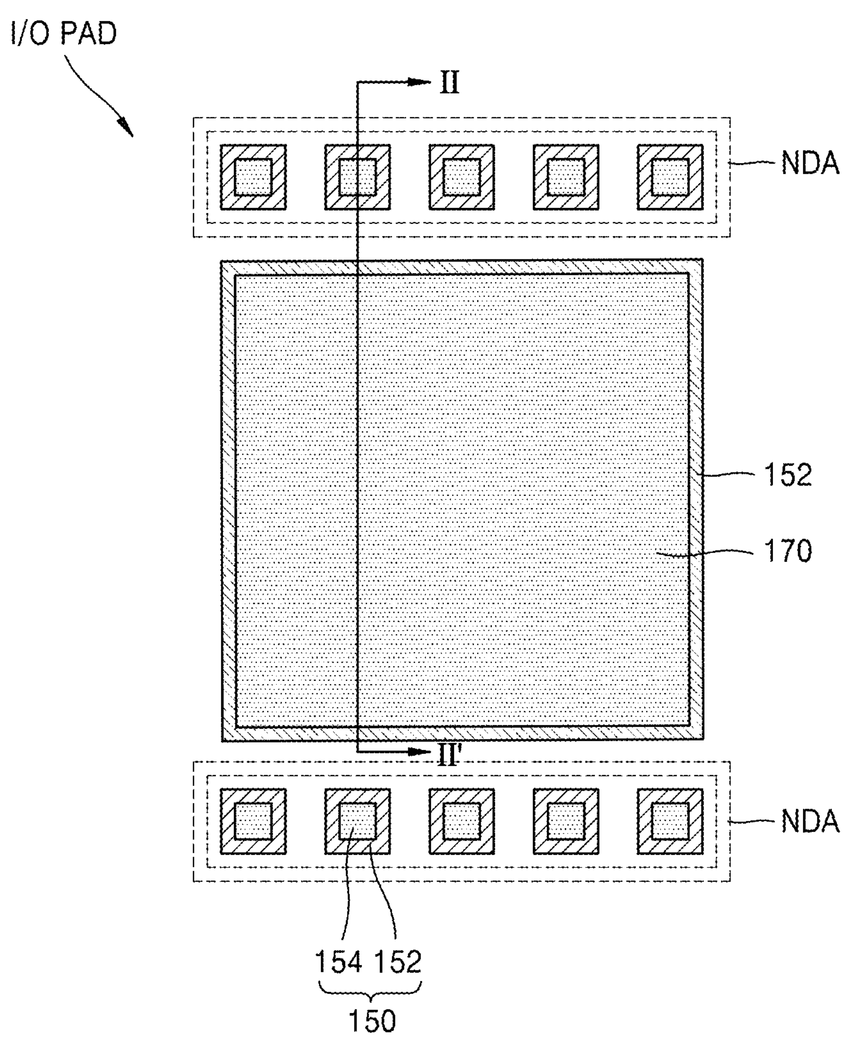
Figure 5B:
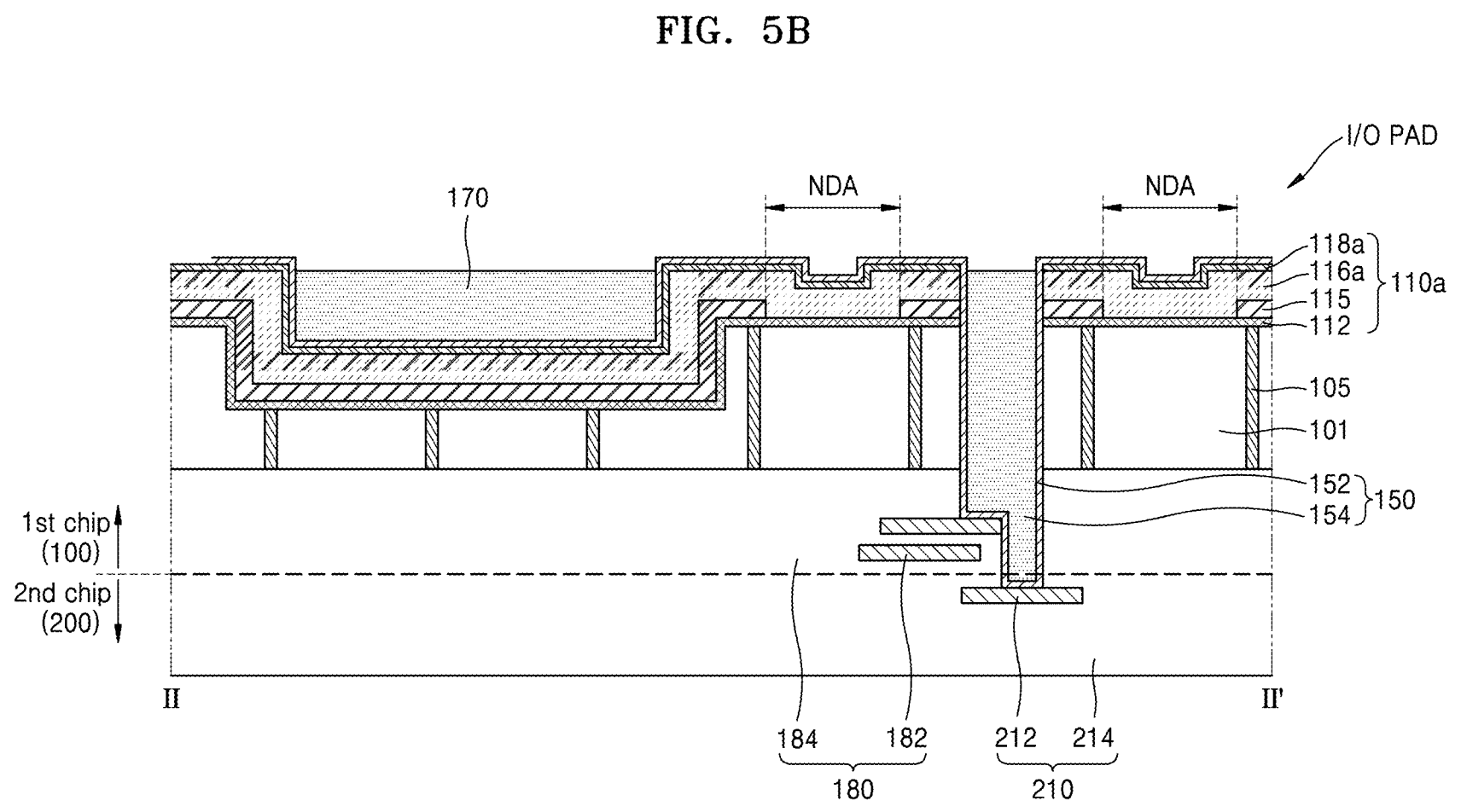
Figure 6A:
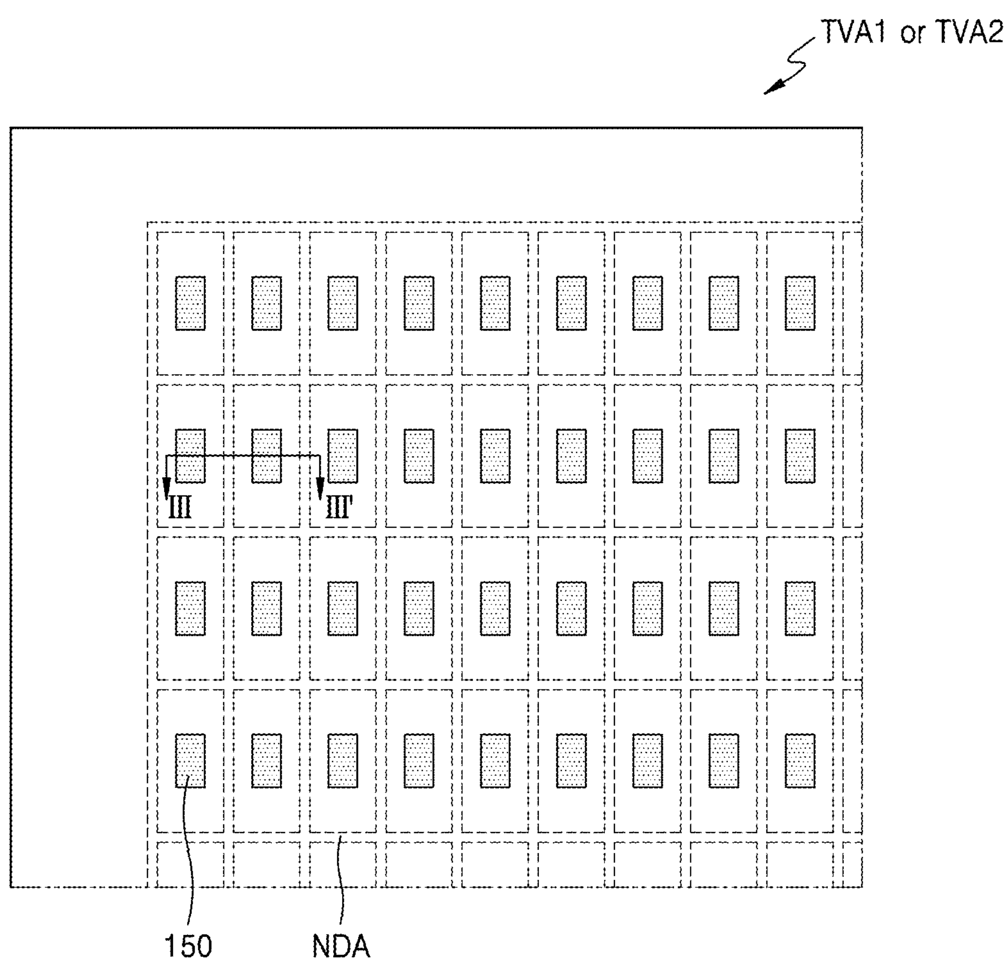
Figure 6B:
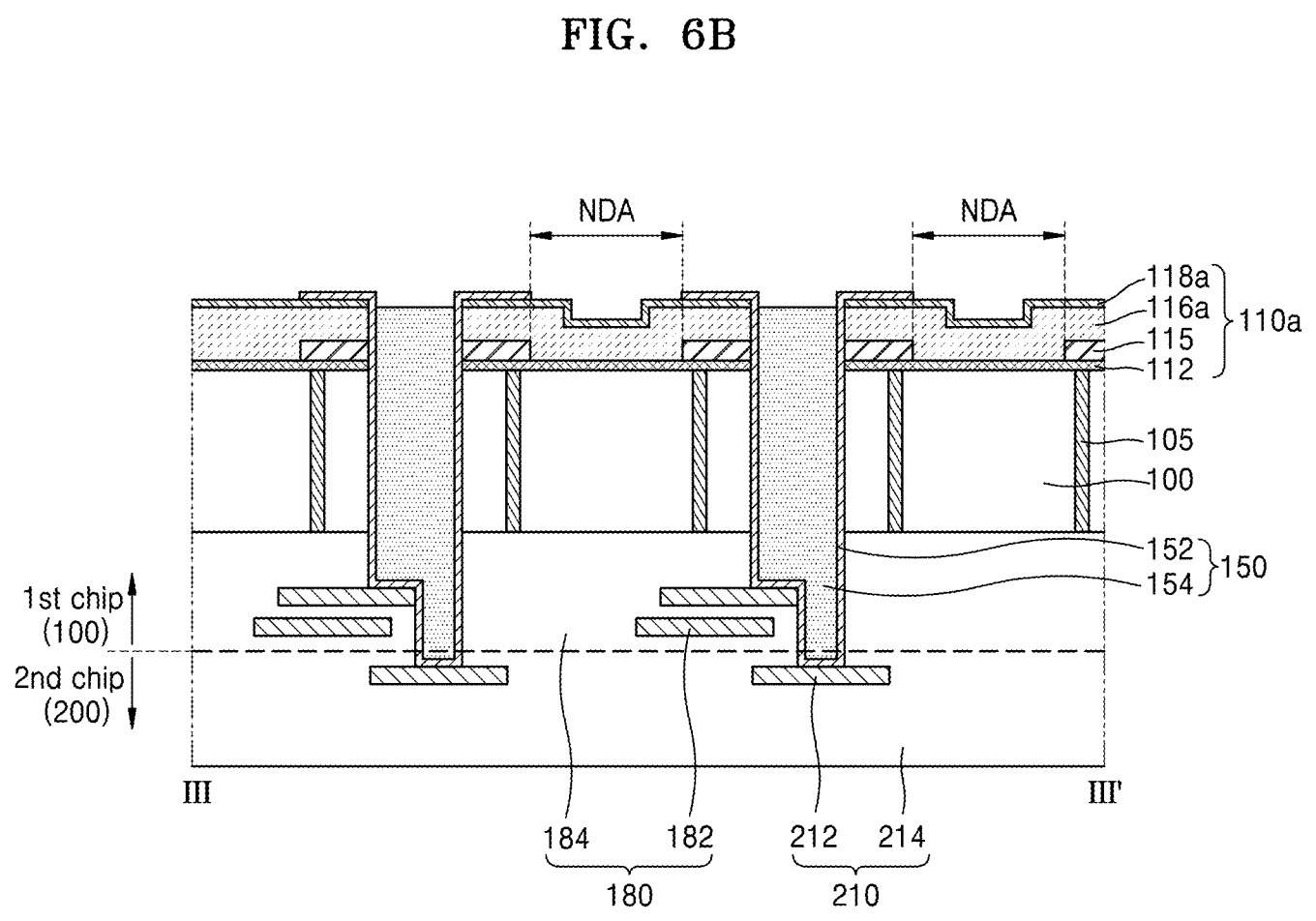
Figure 7A:
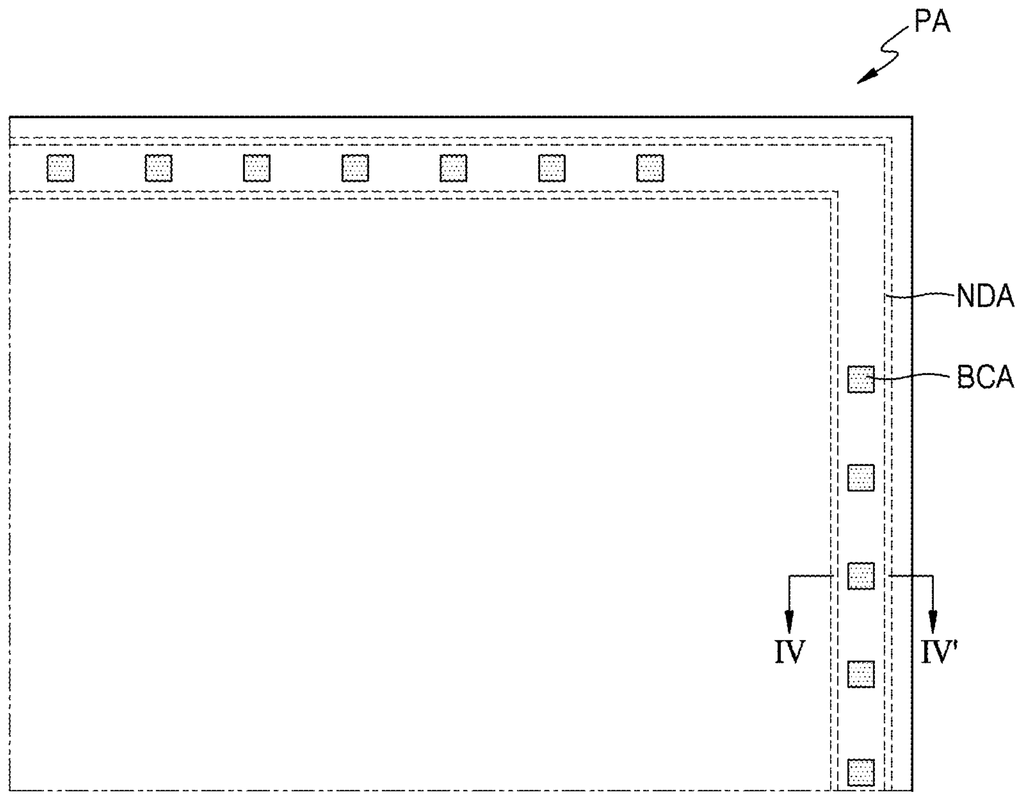
Figure 7B:
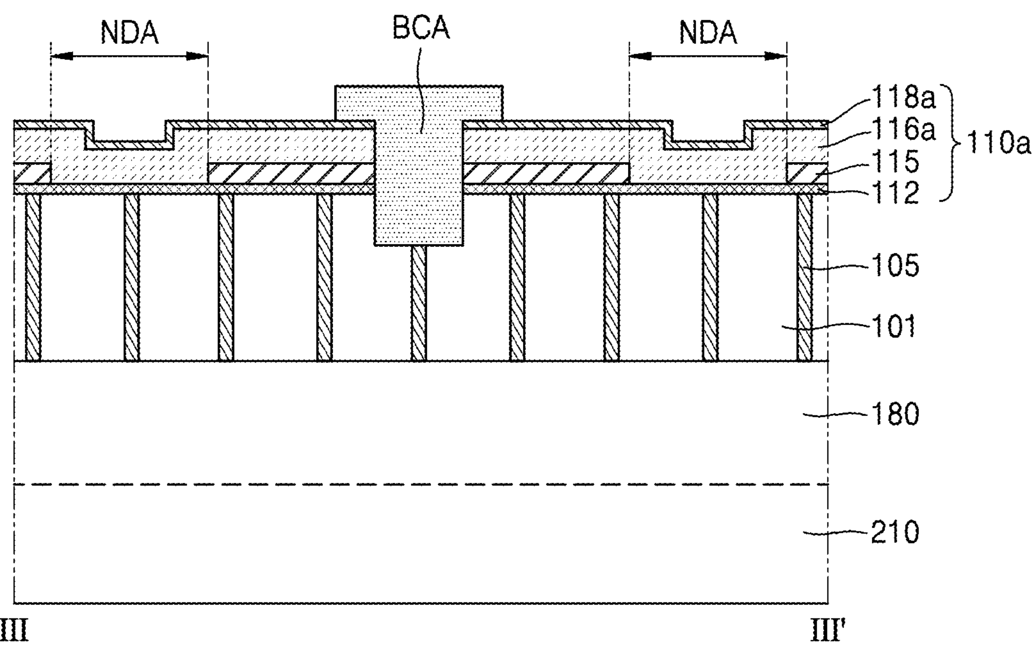

FIGS. 5A to 7B are plan views of node separation portions, in which the structure of the back-side insulating layer 110*a* of FIG. 4C is applied, and cross-sections corresponding thereto. FIGS. 5B, 6B, and 7B are cross-sectional views taken along line II-II' of FIG. 5A, line III-III' of FIG. 6A, and line IV-IV' of FIG. 7A, respectively, according to some example embodiments.

FIGS. 5A and 5B show a node separation portion NDA in an I/O pad area I/O PAD of a first peripheral area PE1, but the example embodiments are not limited thereto. The node separation portion NDA may be located on both sides of a through-via 150, but is not limited thereto. In FIG. 5A, quadrangular dashed lines surrounding the through-vias 150 may correspond to the node separation portion NDA.

FIGS. 6A and 6B show a node separation portion NDA in a first through-via array area TVA1 and/or a second through-via array area TVA2 of a first peripheral area PE1, but the example embodiments are not limited thereto. The node separation portion NDA may be located on both sides of a through-via 150, but is not limited thereto. In FIG. 6A, the grid pattern dashed line surrounding the through-vias 150 may correspond to the node separation portion NDA.

FIGS. 7A and 7B show a node separation portion NDA in an edge of a pixel area PA in which a back-side contact BCA is located, but the example embodiments are not limited thereto. The node separation portion NDA may be located on both sides of the back-side contact BCA, but is not limited thereto. In FIG. 7A, dashed lines surrounding back-side contacts BCA may correspond to the node separation portion NDA.

For reference, the back-side contact BCA may be connected to at least one DTI 105. The DTI 105 may have a structure that passes through a first substrate 101 in a z-direction, but is not limited thereto. As the DTI 105 is formed in a structure that passes through the first substrate 101, crosstalk due to obliquely incident light may be decreased, reduced, and/or prevented. The DTI 105 may include a central conductive layer and an outer insulating layer, etc. The central conductive layer may include, for example, polysilicon and/or impurity-doped polysilicon, etc. However, the material of the central conductive layer is not limited to the above materials. For example, the central conductive layer may include metal, metal silicide, a metal-containing conductive material, and/or the like. The outer insulating layer may surround the outside of the central conductive layer and insulate the central conductive layer from the first substrate 101. The outer insulating layer may include, for example, oxide and/or nitride, such as silicon oxide, silicon nitride, silicon oxynitride, etc.

The back-side contact BCA may be located in an edge portion of the pixel area PA, and may apply power, for example, (−) voltage (e.g., negative voltage), to the central conductive layer of the DTI 105, but the example embodiments are not limited thereto. The (−) voltage is applied to the central conductive layer of the DTI 105 via the back-side contact BCA, and thus, holes that may exist on the surface of the outer insulating layer of the DTI 105 are fixed, thereby improving dark current characteristics, etc.

Figure 8A:
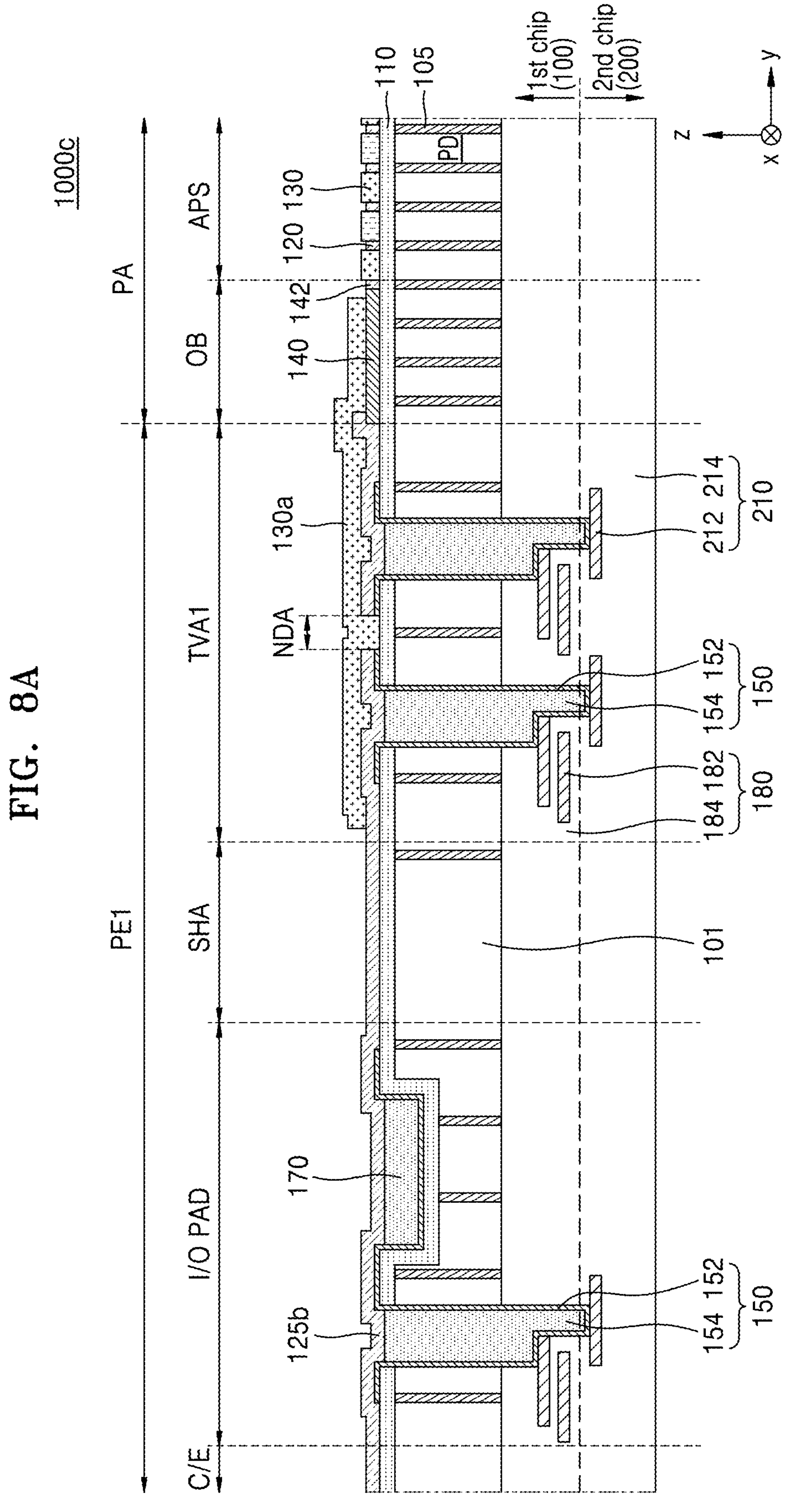
FIGS. 8A and 8B are cross-sectional views of image sensors with stack structures according to some example embodiments and correspond to FIG. 2.
Figure 8B:
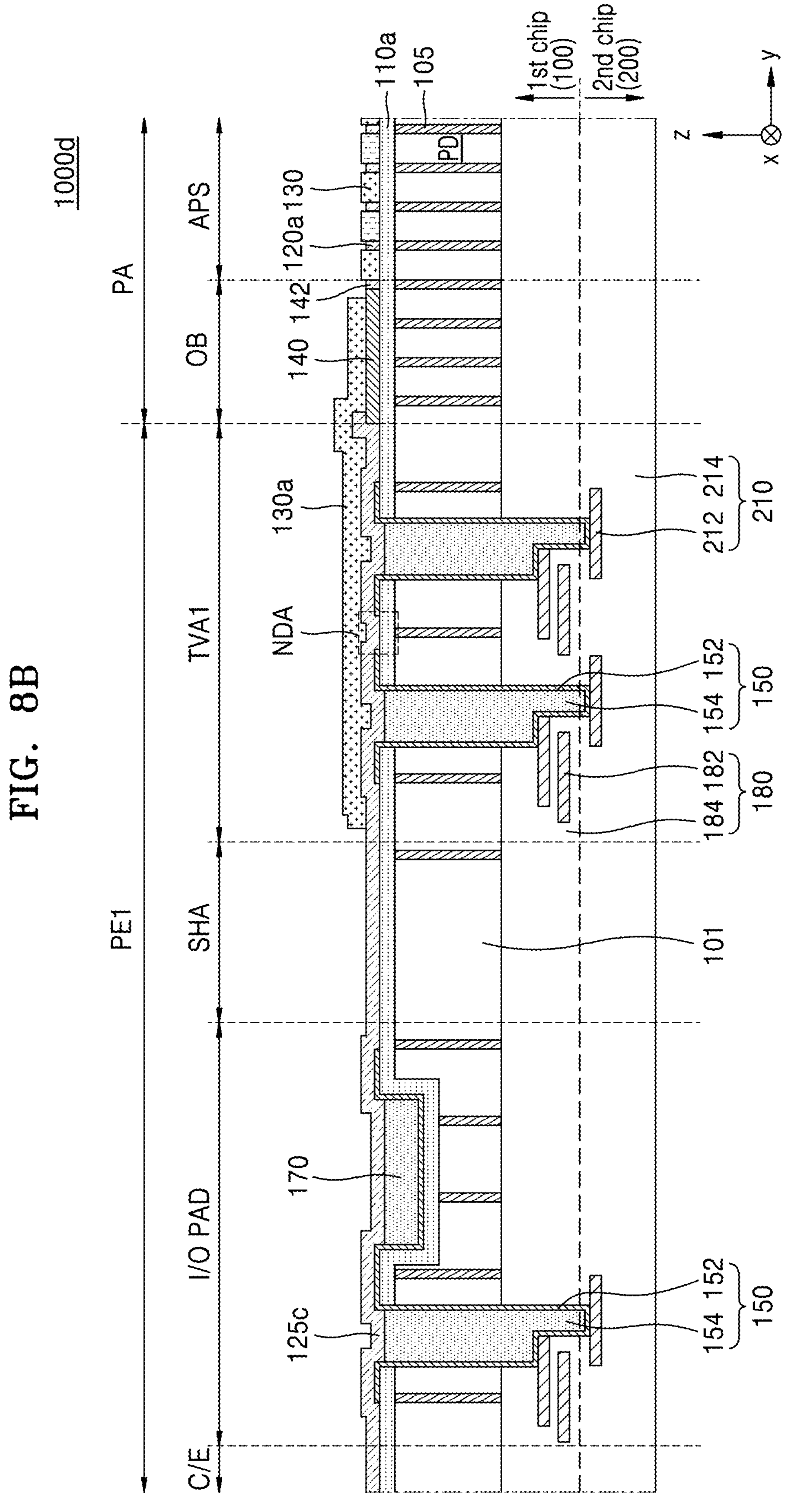

FIGS. 8A and 8B are cross-sectional views of image sensors with stack structures according to some example embodiments and correspond to FIG. 3A, but the example embodiments are not limited thereto. A description is given below with reference to FIG. 1 together, and descriptions already given with reference to FIGS. 1 to 7B are briefly given or omitted.

Referring to FIG. 8A, an image sensor 1000*c* according to at least one example embodiment may be different from the image sensor 1000 or 1000*a* of FIG. 3A or 3B in terms of a structure of a fence insulating layer 125*b* and presence of an additional blue filter layer 130*a*. Specifically, in the image sensor 1000*c* according to at least one example embodiment, the fence insulating layer 125*b* may entirely cover a first peripheral area PE1. That is, the fence insulating layer 125*b* may cover regions above first and second through-via array areas TVA1 and TVA2 as well as a shield area SHA, an I/O pad area I/O PAD, and a chip edge area C/E, but is not limited thereto. In addition, the fence insulating layer 125*b* may also cover a portion of a first metal layer 140 in an optical black pixel area OB, etc. According to at least one example embodiment, the fence insulating layer 125*b* may not cover the first metal layer 140 in the optical black pixel area OB.

A fence 120 and the fence insulating layer 125*b* may include a lower conductive layer 122 and an upper insulating layer 124, and a back-side insulating layer 110 may have the structure of FIG. 4A, but is not limited thereto. Therefore, in the first and second through-via array areas TVA1 and TVA2, node separation is desired and/or required between through-vias 150. Accordingly, as illustrated in FIG. 8A, the fence insulating layer 125*b* may be disconnected in a node separation portion NDA, but is not limited thereto.

Also, in the image sensor 1000*c* according to at least one example embodiment, the optical black pixel area OB and the first and second through-via array areas TVA1 and TVA2 may be covered by the additional blue filter layer 130*a*, but the example embodiments are not limited thereto. For example, the additional blue filter layer 130*a* may cover the fence insulating layer 125*b* on the first and second through-via array areas TVA1 and TVA2 and the first metal layer 140 of the optical black pixel area OB, etc. As the additional blue filter layer 130*a* is provided as described above, it is possible to block input of light into the first and second through-via array areas TVA1 and TVA2 and/or to further strengthen blocking of input of light into the optical black pixel area OB, etc. For reference, when a blue filter is formed in an active pixel sensor area APS, the additional blue filter layer 130*a* may be formed together, but the example embodiments are not limited thereto.

Referring to FIG. 8B, an image sensor 1000*d* according to at least one example embodiment may be different from the image sensor 1000*c* of FIG. 8A in terms of a structure of a fence insulating layer 125*c*. Specifically, in the image sensor 1000*d* according to at least one example embodiment, the fence insulating layer 125*c* may entirely cover a first peripheral area PE1 and a portion of a first metal layer 140 of an optical black pixel area OB, but is not limited thereto. According to at least one example embodiment, the fence insulating layer 125*c* may not cover the first metal layer 140 in the optical black pixel area OB, etc.

A fence 120*a* and the fence insulating layer 125*c* may include a single insulating layer, and a back-side insulating layer 110*a* may have the structure of FIG. 4B, but the example embodiments are not limited thereto. Therefore, in first and second through-via array areas TVA1 and TVA2, node separation by the back-side insulating layer 110*a* is desired and/or required between through-vias 150. Accordingly, although not illustrated in FIG. 8B, a $TiO_2$ layer 115 of the back-side insulating layer 110*a* may be disconnected in a node separation portion NDA. The node separation is made by the back-side insulating layer 110*a* as described above, and thus, the fence insulating layer 125*c* may be continuously connected in the node separation portion NDA without disconnection, as illustrated in FIG. 8B, but is not limited thereto.

Also, even in the image sensor 1000*d* according to at least one example embodiment, the optical black pixel area OB and the first and second through-via array areas TVA1 and TVA2 may be covered by an additional blue filter layer 130*a*, but is not limited thereto. For example, the additional blue filter layer 130*a* may cover the fence insulating layer 125*c* on the first and second through-via array areas TVA1 and TVA2 and the first metal layer 140 of the optical black pixel area OB, etc.

In the image sensors 1000*c* and 1000*d* of FIGS. 8A and 8B, as the fence insulating layers 125*b* and 125*c* entirely cover the first peripheral area PE1, the differences in height between the patterns may be decreased and/or minimized over the entirety of the first peripheral area PE1. Therefore, a color filter 130 may be smoothly formed during a spin coating process, and stain defects may be significantly improved (e.g., may be significantly decreased, reduced, etc.). For reference, since the image sensors 1000*c* and 1000*d* of FIGS. 8A and 8B have a structure in which the fence insulating layers 125*b* and 125*c* are extended on the first and second through-via array areas TVA1 and TVA2, the sizes and/or profiles of the through-vias 150 may not be changed, etc.

FIGS. 9A to 9G are cross-sectional views schematically showing a process of a method of manufacturing the image sensor 1000 with the stack structure of FIG. 1 according to some example embodiments. A description is given below with reference to FIG. 8A together, and descriptions already given with reference to FIGS. 1 to 8B are briefly given or omitted, but the example embodiments are not limited thereto. Also, in FIGS. 9A to 9G, only a portion of a first through-via array area TVA1 of a first peripheral area PE1 is illustrated for the sake of clarity and convenience of description.

Figure 9A:
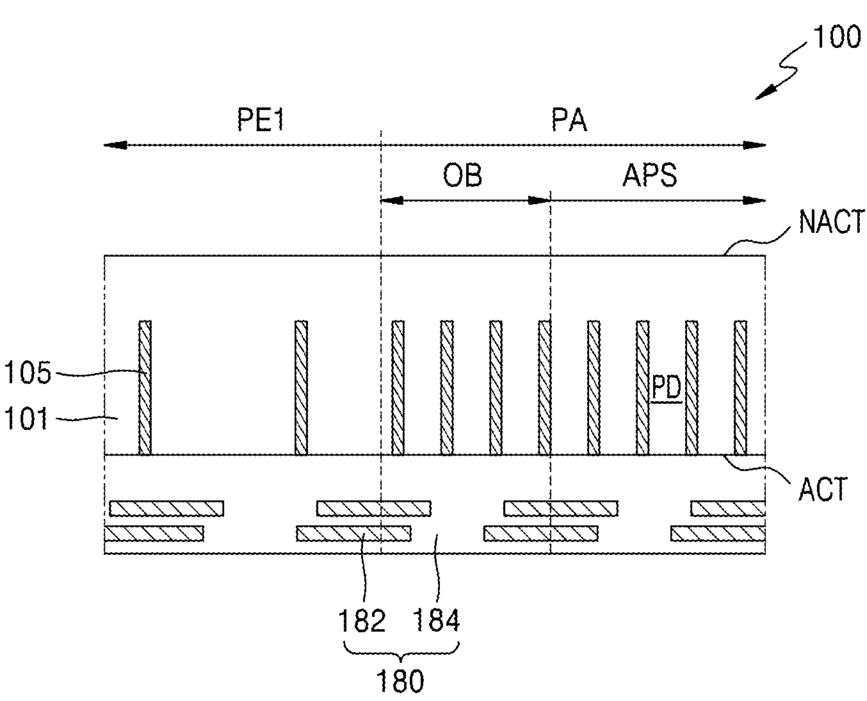
FIGS. 9A to 9G are cross-sectional views schematically showing a process of a method of manufacturing the image sensor with the stack structure of FIG. 1 according to some example embodiments.

Referring to FIG. 9A, in a method of manufacturing an image sensor with a stack structure according to at least one example embodiment (hereinafter, simply referred to as a 'method of manufacturing an image sensor'), a first semiconductor chip 100 is prepared. Specifically, pixels are formed in a pixel area PA of a first substrate 101 of a first semiconductor chip 100. Each of the pixels may include a photodiode PD and a pixel transistor (not shown), but are not limited thereto. Here, the pixels may be separated from each other by a DTI 105. The DTI 105 may also be located in the first peripheral area PE1.

After the pixels are formed in the pixel area PA, a first wiring layer 180 is formed on the lower surface of the first substrate 101. Here, the lower surface of the first substrate 101 represents an active surface ACT, and the upper surface of the first substrate 101 represents a non-active surface NACT. That is, the lower surface of the first substrate 101 may correspond to the front side, and the upper surface of the first substrate 101 may correspond to the back side. The first wiring layer 180 may include a plurality of first lines 182 and/or a first interlayer insulating layer 184, etc. The first lines 182 may be respectively connected to pixel transistors.

Figure 9B:
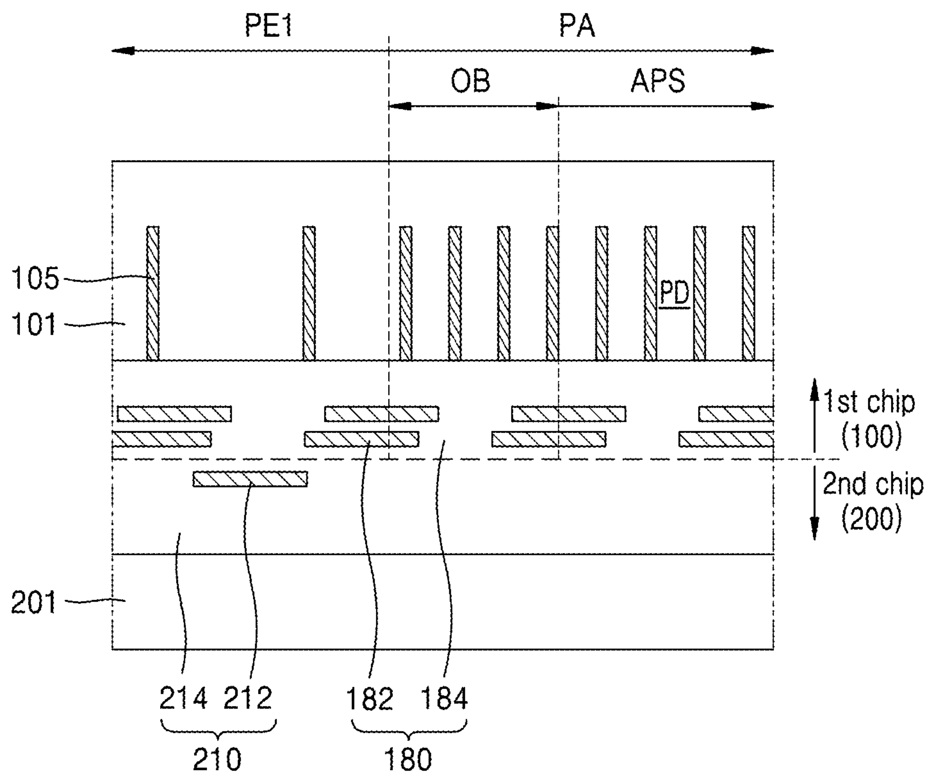

Next, referring to FIG. 9B, a second semiconductor chip 200 is prepared. Specifically, one or more logic elements (not shown) are formed in a second substrate 201 of the second semiconductor chip 200, and a second wiring layer 210 is formed on an active surface of the second substrate 201. In FIG. 9B, the upper surface of the second substrate 201 may represent an active surface, and the lower surface of the second substrate 201 may represent a non-active surface. The second wiring layer 210 may include a plurality of second lines 212 and/or a second interlayer insulating layer 214, etc. In FIG. 9B, only one second line 212 is illustrated for clarity and convenience of description. However, in some example embodiments, a plurality of second lines 212 in multiple layers may be arranged in the second interlayer insulating layer 214, and the second lines 212 may be connected to one or more logic elements of the second substrate 201, etc.

According to some example embodiments, preparation of the second semiconductor chip 200 may be performed in parallel with preparation of the first semiconductor chip 100, but is not limited thereto. In other words, there may be no preference in order between the preparation of the second semiconductor chip 200 and the preparation of the first semiconductor chip 100. In addition, the preparation of the first semiconductor chip 100 and the preparation of the second semiconductor chip 200 are illustrated in units of chips in FIGS. 9A and 9B, but may be actually performed in units of wafers. In other words, the preparation of the first semiconductor chip 100 may correspond to preparation of a first wafer including a plurality of first semiconductor chips 100, and the preparation of the second semiconductor chip 200 may correspond to preparation of a second wafer including a plurality of second semiconductor chips 200, etc.

After preparation of the first semiconductor chip 100 and the second semiconductor chip 200, the first semiconductor chip 100 and the second semiconductor chip 200 are coupled to each other by direct bonding, but is not limited thereto. For example, the first wiring layer 180 of the first semiconductor chip 100 may be coupled to the second wiring layer 210 of the second semiconductor chip 200. Specifically, the first interlayer insulating layer 184 of the first wiring layer 180 may be coupled to the second interlayer insulating layer 214 of the second wiring layer 210 by, e.g., direct bonding, etc. Also, the coupling between the first semiconductor chip 100 and the second semiconductor chip 200 may be performed in units of wafers. In other words, the first wafer including the plurality of first semiconductor chips 100 may be coupled to the second wafer including the plurality of second semiconductor chips 200 by, e.g., the direct bonding, etc.

Figure 9C:
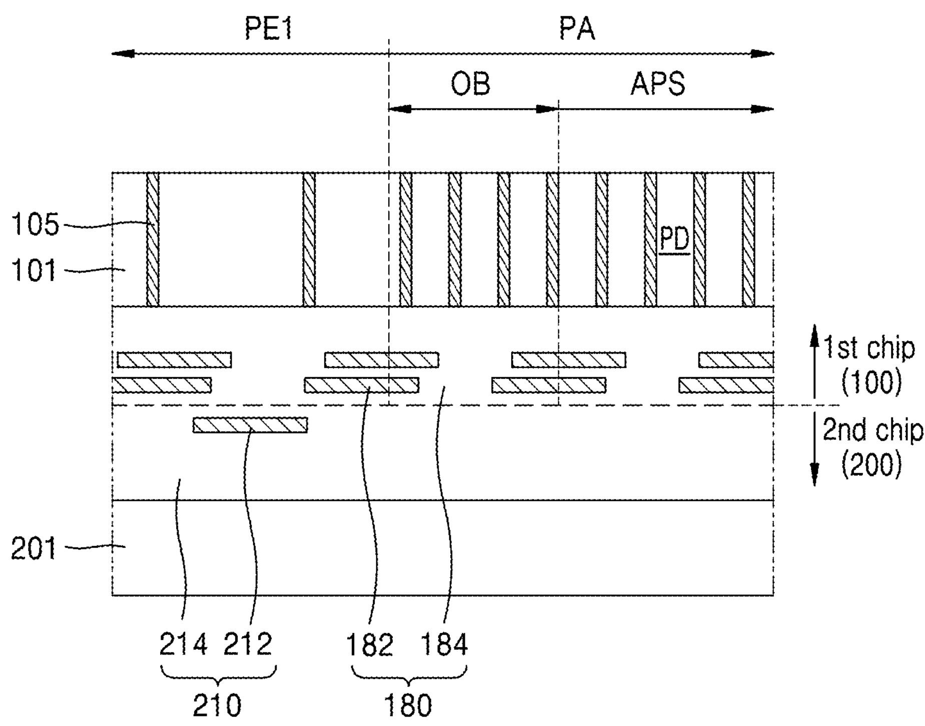

Referring to FIG. 9C, after the first semiconductor chip 100 and the second semiconductor chip 200 are coupled to each other, a portion of the back side of the first substrate 101 of the first semiconductor chip 100 is removed to thin the first substrate 101. The removal of the back side of the first semiconductor chip 100 may be performed by, for example, a back-lap process, such as grinding and/or chemical mechanical polishing (CMP), etc. As shown in FIG. 9C, the DTI 105 may be exposed by removing the back side of the first substrate 101. For example, during a back-lap process, the DTI 105 may act as an etch stop layer.

Figure 9D:
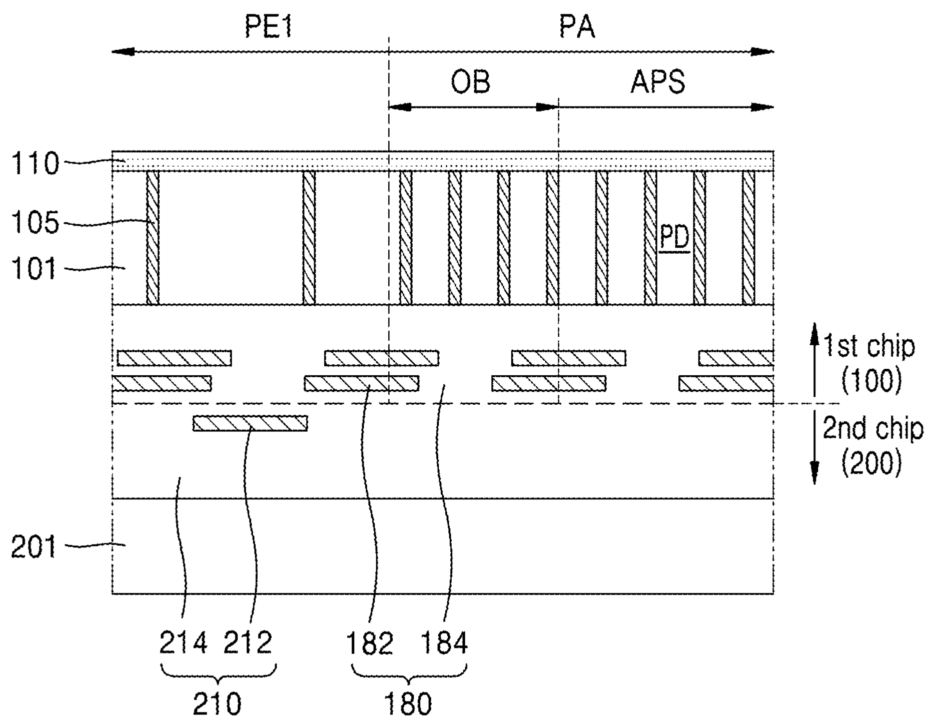

Referring to FIG. 9D, after thinning the first substrate 101, a back-side insulating layer 110 is formed on the back side of the first substrate 101. The back-side insulating layer 110 may have the structure of FIG. 4A, but the example embodiments are not limited thereto. However, a back-side insulating layer 110*a* having the structure of FIG. 4B may be formed instead of the back-side insulating layer 110, etc. For example, when a fence and a fence insulating layer formed subsequently have a double layer structure including a lower conductive layer 122, the back-side insulating layer 110 of FIG. 4A may be formed. On the other hand, when the fence and the fence insulation layer have a structure of a single insulating layer, the back-side insulating layer 110*a* of FIG. 4B may be formed. Hereinafter, for convenience of description, the structure of the back-side insulating layer 110 of FIG. 4A is described, but the example embodiments are not limited thereto.

Figure 9E:
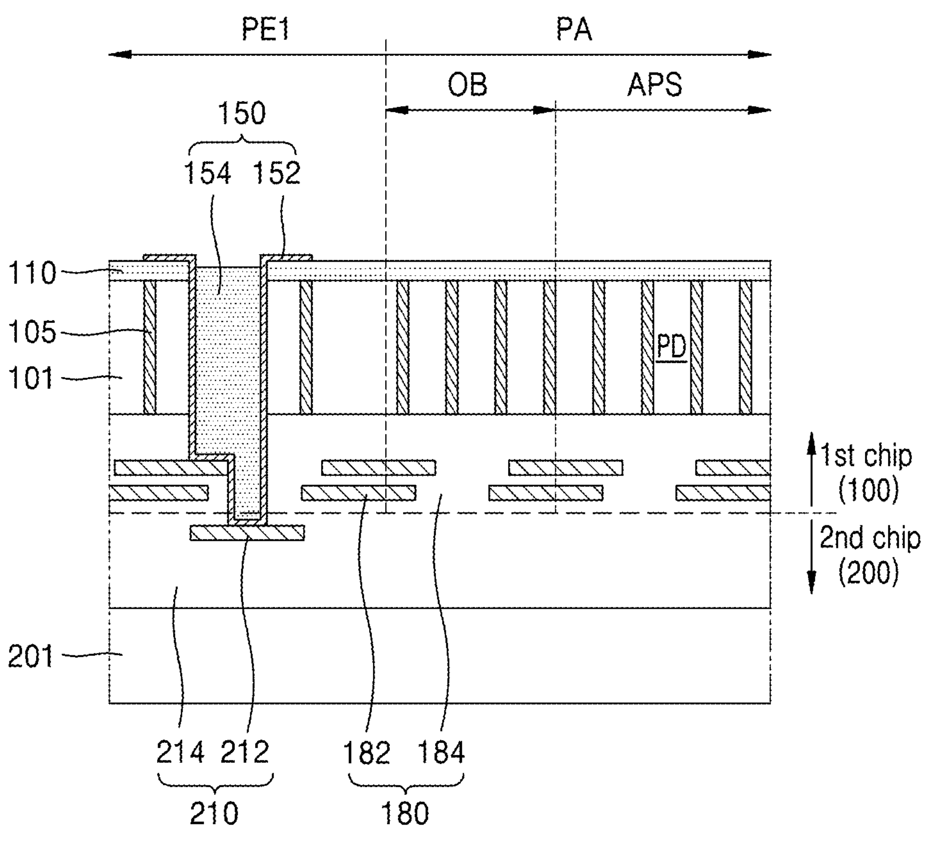

Referring to FIG. 9E, subsequently, at least one through-via 150 is formed in a first through-via array area TVA1. The through-via 150 may include an outer conductive layer 152 and a via metal layer 154, etc. The outer conductive layer 152 may include at least one metal layer. For example, the outer conductive layer 152 may include titanium (Ti)/titanium nitride (TiN) and/or tungsten (W), etc., and/or the via metal layer 154 may include aluminum (Al), etc. However, the materials of the outer conductive layer 152 and the via metal layer 154 are not limited to the above conductive materials.

As illustrated in FIG. 9E, the through-via 150 may be connected to the first lines 182 of the first wiring layer 180 and may also be connected to the second lines 212 of the second wiring layer 210 of the second semiconductor chip 200. That is, the through-vias 150 may connect the first lines 182 and the second lines 212 to each other. Also, although not illustrated, the through-via 150 and/or a pad 170, etc., may also be formed in an I/O pad area I/O PAD. The through-via 150 of the I/O pad area I/O PAD may also be connected to the pad 170.

Figure 9F:
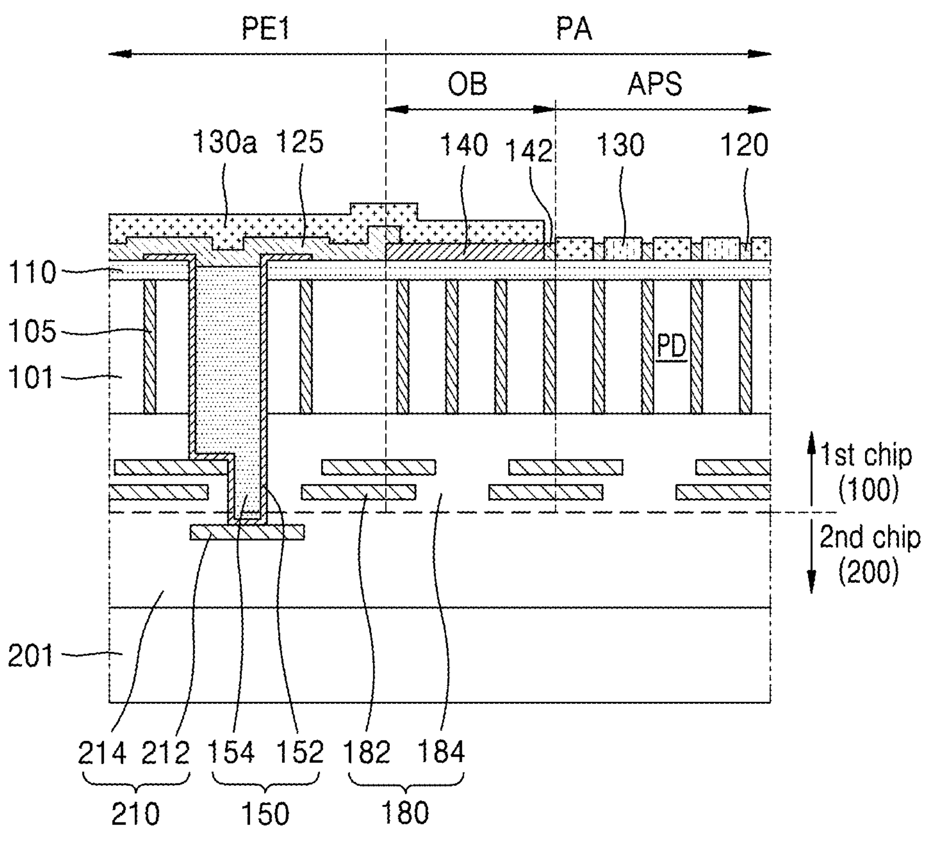

Next, referring to FIG. 9F, a first metal layer 140 is formed in an optical black pixel area OB. In addition, at least one color filter 130 is formed in an active pixel sensor area APS. When forming the color filter 130, an additional blue filter layer 130*a* may be formed to cover first and/or second through-via array areas TVA1 and TVA2 of the first peripheral area PE1, etc., but the example embodiments are not limited thereto. According to at least one example embodiment, the additional blue filter layer 130*a* may be omitted.

The color filter 130 may be arranged in a 2-dimensional array structure corresponding to the pixels, but is not limited thereto. In at least one example embodiment, the color filter 130 may have a Bayer pattern structure including a red filter, a green filter, and a blue filter, etc. In at least one example embodiment, the color filter 130 may include a yellow filter, a magenta filter, and a cyan filter, etc. In addition, the color filter 130 may additionally include a white filter.

Also, before forming the color filter 130, a fence 120 and/or a fence insulating layer 125 may be formed, etc. Accordingly, the additional blue filter layer 130*a* may cover the fence insulating layer 125. In addition, the fence 120 and the fence insulating layer 125 may include the lower conductive layer 122, and thus, the fence insulating layer 125 may be disconnected in a node separation portion. However, if the fence 120 and the fence insulating layer 125 include only an insulating layer, a $TiO_2$ layer 115 of the back-side insulating layer 110*a* is disconnected in the node separation portion, but the fence insulating layer 125 may not be disconnected.

A process of forming the first metal layer 140, the fence 120, and the fence insulating layer 125 in the optical black pixel area OB is described below in more detail in the description of FIGS. 10A to 10C.

Figure 9G:
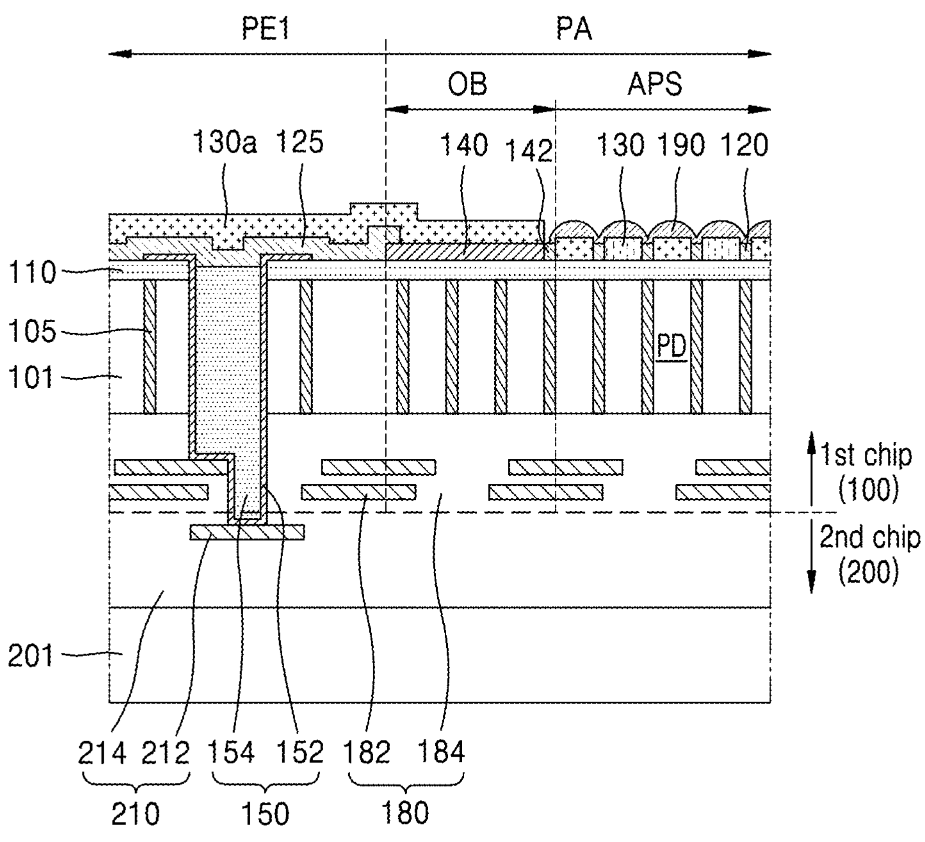

Referring to FIG. 9G, after forming the color filter 130 and/or the additional blue filter layer 130*a*, a micro lens 190 is formed on the color filter 130, etc. Specifically, a lens material layer is formed on the color filter 130, and a photoresist (PR) pattern is formed on the lens material layer using a photolithography process. Then, a reflow process is performed on the PR pattern to make the PR pattern into a hemispherical shape, but the example embodiments are not limited thereto, and for example the PR pattern may be formed into a different shape. Subsequently, the micro lens 190 is formed by patterning the lens material layer using the PR pattern as a mask. Also, according to at least one example embodiment, a planarization lens layer may be formed on the color filter 130 and/or the micro lens 190 may be formed on the planarization lens layer, but are not limited thereto.

Figure 10A:
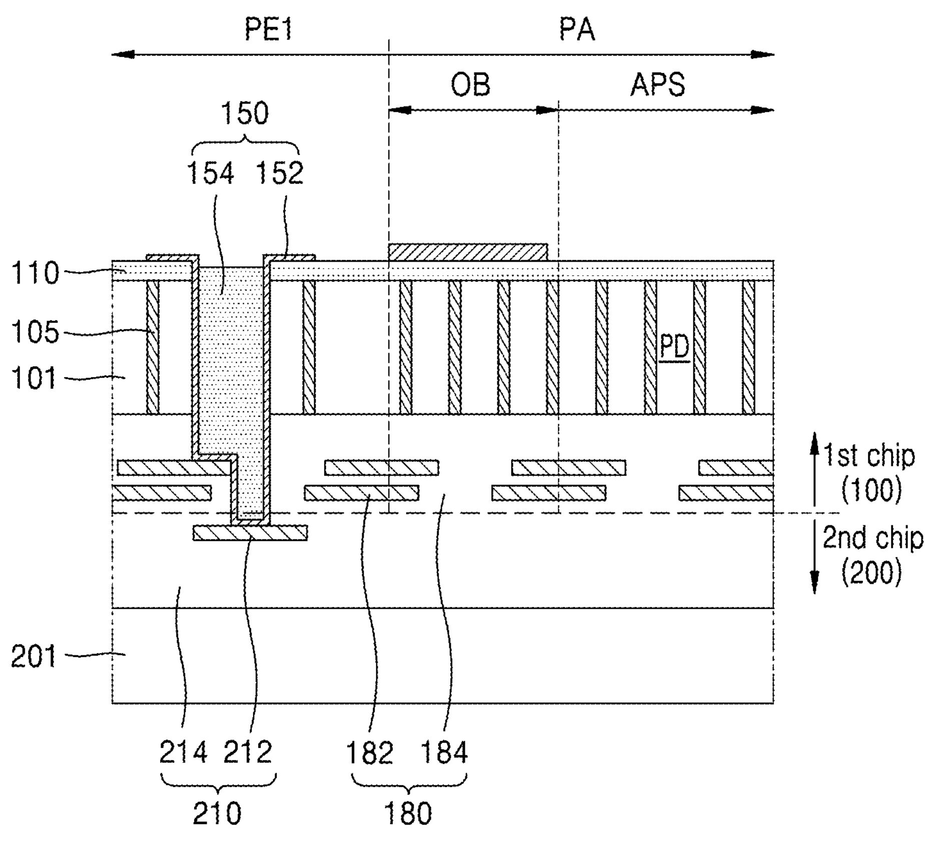
FIGS. 10A to 10C are cross-sectional views showing a process of forming a fence and a fence insulating layer in more detail in relation to forming color filters of FIG. 9F according to some example embodiments.
Figure 10B:
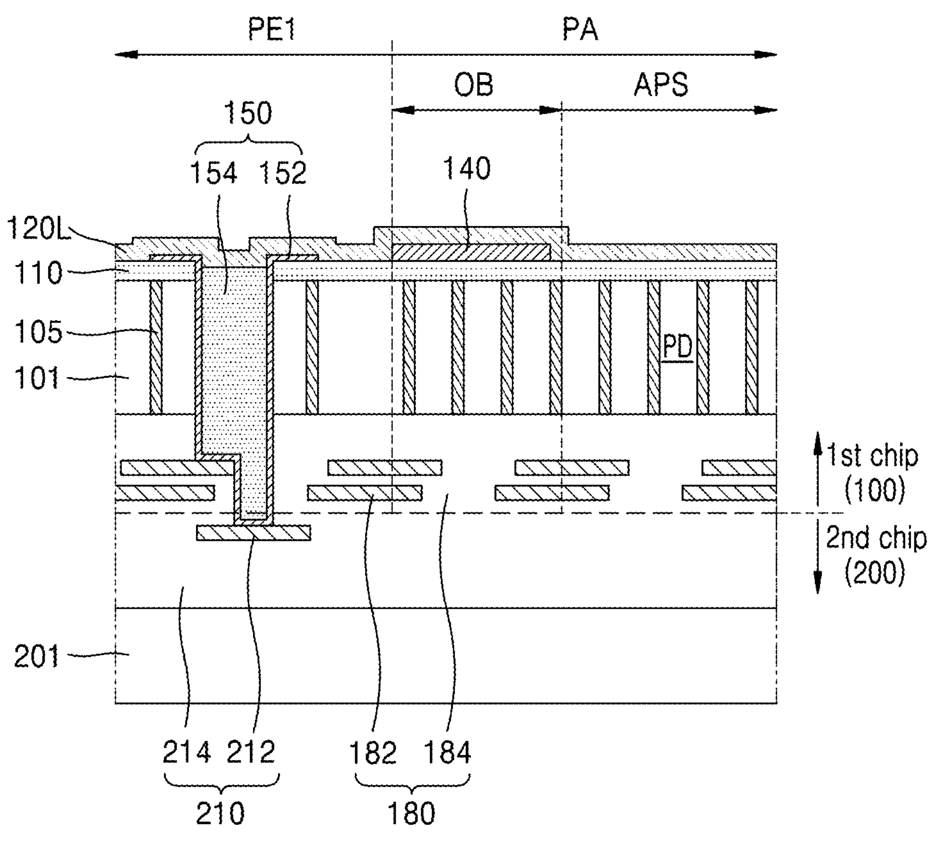
Figure 10C:
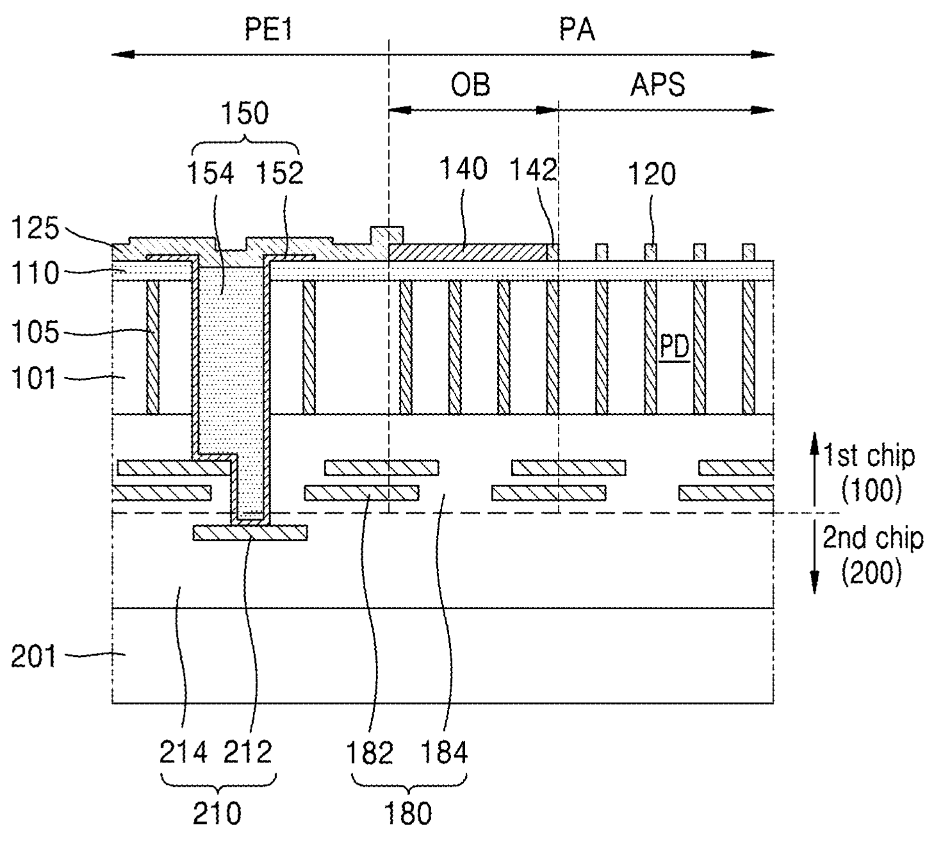

FIGS. 10A to 10C are cross-sectional views showing a process of forming a fence and a fence insulating layer in more detail in relation to forming color filters of FIG. 9F according to some example embodiments. A description is given below with reference to FIGS. 8A and 9F together, and descriptions already given with reference to FIGS. 1 to 9G are briefly given or omitted, but the example embodiments are not limited thereto. Also, even in FIGS. 10A to 10C, only a portion of a first through-via array area TVA1 of a first peripheral area PE1 is illustrated for convenience of description and for the sake of clarity, but the example embodiments are not limited thereto.

Referring to FIG. 10A, the back-side insulating layer 110 is formed on the back side of the first substrate 101, but is not limited thereto. Also, as illustrated in FIG. 9E, the through-via 150 is formed in the first through-via array area TVA1, but is not limited thereto. Then, the first metal layer 140 is formed on the optical black pixel area OB. The first metal layer 140 may include, for example, tungsten (W), etc. However, the material of the first metal layer 140 is not limited to tungsten (W) and may be a different metal and/or metal alloy. Also, although not illustrated, when a second metal layer 160 is formed in a shield area SHA, the second metal layer 160 may be formed together with the first metal layer 140. Hereinafter, when the second metal layer 160 exists in the shield area SHA, the second metal layer 160 may be regarded as the same and/or substantially the same as the first metal layer 140.

Referring to FIG. 10B, after forming the first metal layer 140 on the optical black pixel area OB, a fence insulating layer 120L is formed on the entire back side of the first substrate 101, but the example embodiments are not limited thereto. The fence insulating layer 120L may cover an exposed region of the back-side insulating layer 110 and/or structures on the back-side insulating layer 110. For example, the fence insulating layer 120L may cover the back-side insulating layer 110 in the active pixel sensor area APS and the first metal layer 140 in the optical black pixel area OB, etc. Also, the fence insulating layer 120L may cover the through-via 150 in the first through-via array area TVA1, etc.

Referring to FIG. 10C, the fence insulating layer 120L is subsequently patterned by a photolithography process. Accordingly, the fence 120 is formed in the active pixel sensor area APS, and the fence insulating layer 125 is formed in the first peripheral area PE1. Here, the fence insulating layer 120L on the first metal layer 140 in the optical black pixel area OB is removed. Also, the fence insulating layer 120L may remain on at least one side surface of the first metal layer 140 to form a first spacer 142, but the example embodiments are not limited thereto. According to at least one example embodiment, the first spacer 142 may not be formed, e.g., the first spacer 142 may be omitted.

In the first peripheral area PE1, the fence insulating layer 125 may cover the exposed region of the back-side insulating layer 110 and/or the structures on the back-side insulating layer 110. Various structures of the fence insulating layer 125 are respectively illustrated in the image sensors 1000, 1000*a*, 1000*c*, and 1000*d* of FIGS. 3A, 3B, 8A, and 8B, but the example embodiments are not limited thereto. After the fence 120 and the fence insulating layer 125 are formed, the color filter 130 and the additional blue filter layer 130*a* are formed thereon. Accordingly, the structure of FIG. 9F may be formed.

While various example embodiments of the inventive concepts have been particularly shown and described, it will be understood that various changes in form and details may be made therein without departing from the spirit and scope of the following claims.

What is claimed is:

1. An image sensor with a stack structure, the image sensor comprising:

a first semiconductor chip including a pixel area and a peripheral area, the pixel area including a plurality of pixels; and a second semiconductor chip coupled to a lower surface of the first semiconductor chip, the second semiconductor chip including a plurality of logic elements, the pixel area including a plurality of color filters and a fence in the pixel area, the plurality of color filters corresponding to the plurality of pixels, the fence having a grid pattern, and each of the color filters of the plurality of color filters separated from each other by the fence, the peripheral area including a shield area and a shield outer area, the shield area surrounding the pixel area, and a fence insulating layer included in the shield outer area, the fence insulating layer including a same material as the fence.

2. The image sensor of claim 1, wherein the first semiconductor chip comprises:

a first substrate and a first wiring layer on a lower surface of the first substrate;

the plurality of pixels are included in the first substrate in the pixel area;

a back-side insulating layer on an upper surface of the first substrate;

the fence, the plurality of color filters, and the fence insulating layer are on the back-side insulating layer; and the fence and the fence insulating layer have a same thickness from an upper surface of the back-side insulating layer.

3. The image sensor of claim 2, wherein the back-side insulating layer includes a metal layer or the fence insulating layer in the shield area.

4. The image sensor of claim 2, wherein each of the fence and the fence insulating layer comprises a lower conductive layer and an upper insulating layer;

the back-side insulating layer comprises an AlO layer, a first HfOx layer, a tetraethyl orthosilicate (TEOS) layer, and a second HfOx layer, the AlO layer, the first HfOx layer, the TEOS layer, and the second HfOx layer being sequentially stacked; and the second HfOx layer is an etch stop layer on a metal layer or a film of the fence.

5. The image sensor of claim 2, wherein each of the fence and the fence insulating layer comprises a single insulating layer; and the back-side insulating layer comprises an AlO layer, a $TiO_2$ layer, a tetraethyl orthosilicate (TEOS) layer, and an HfOx layer, the AlO layer, the $TiO_2$ layer, the TEOS layer, and the HfOx layer being sequentially stacked.

6. The image sensor of claim 5, wherein the $TiO_2$ layer is disconnected at a separation portion of the back-side insulating layer; and the AlO layer, the TEOS layer, and the HfOx layer are continuously connected in the separation portion.

7. The image sensor of claim 1, wherein the peripheral area comprises the shield area, an I/O pad area, and a chip edge area, the I/O pad area outside the shield area, and the chip edge area includes an outermost portion of the first semiconductor chip;

at least one through-via array area is in at least a portion of the shield area; and the fence insulating layer covers the I/O pad area and the chip edge area.

8. The image sensor of claim 7, further comprising:

a metal layer in the shield area outside the at least one through-via array area; and a spacer comprising a same material as the fence, the spacer on at least one side surface of the metal layer.

9. The image sensor of claim 7, wherein the fence insulating layer is in the shield area outside the at least one through-via array area.

10. The image sensor of claim 7, wherein the at least one through-via array area comprises a first plurality of through-vias;

the I/O pad area comprises at least one pad and a second plurality of through-vias; and the fence insulating layer covers a region above the second plurality of through-vias, a region above the the at least one pad, a region between the first plurality of through-vias, and a region between the at least one through-via array area and the I/O pad area.

11. An image sensor with a stack structure, the image sensor comprising:

a first semiconductor chip including a substrate and at least one wiring layer, the substrate including a pixel area, a peripheral area, and a back-side insulating layer, the at least one wiring layer on a lower surface of the substrate, the pixel area including a plurality of pixels, and the back-side insulating layer on an upper surface of the substrate;

a second semiconductor chip coupled to a lower surface of the first semiconductor chip, the second semiconductor chip including a plurality of logic elements;

the back-side insulating layer including a fence, a plurality of color filters, and a $TiO_2$ layer, the fence and the plurality of color filters in the pixel area, the fence including a single insulating layer having a grid pattern, and each color filter of the plurality of color filters separated from each other by the fence; and a fence insulating layer on an I/O pad area and at least one through-via array area of the peripheral area, the fence insulating layer comprising a same material as the fence.

12. The image sensor of claim 11, wherein the back-side insulating layer comprises an AlO layer, the $TiO_2$ layer, a tetraethyl orthosilicate (TEOS) layer, and an HfOx layer, the AlO layer, the $TiO_2$ layer, the TEOS layer, and the HfOx layer being sequentially stacked;

the $TiO_2$ layer is disconnected at a node separation portion of the back-side insulating layer; and the AlO layer, the TEOS layer, and the HfOx layer are continuously connected in the node separation portion.

13. The image sensor of claim 11, wherein the peripheral area comprises a shield area, the I/O pad area, and a chip edge area, the shield area surrounding the pixel area, the I/O pad area located outside the shield area and includes at least one pad and a plurality of first through-vias, and the chip edge area includes an outermost portion of the first semiconductor chip; and the at least one through-via array area is located in at least a portion of the shield area and comprises a plurality of second through-vias.

14. The image sensor of claim 13, wherein the fence insulating layer covers a region above the plurality of first through-vias, a region above the at least one pad, a region between the plurality of second through-vias, and a region of the back-side insulating layer exposed in the peripheral area.

15. The image sensor of claim 14, further comprising:

an optical black (OB) pixel area, the OB pixel area including a metal layer; and a material layer including the plurality of color filters, the material layer covering the metal layer in the OB pixel area and the fence insulating layer in the at least one through-via array area.

16. An image sensor with a stack structure, the image sensor comprising:

a first semiconductor chip including a substrate and a wiring layer, the substrate including a pixel area, a peripheral area, and a back-side insulating layer, the wiring layer on a lower surface of the substrate, the pixel area including a plurality of pixels, and the back-side insulating layer on an upper surface of the substrate; and a second semiconductor chip coupled to a lower surface of the first semiconductor chip, the second semiconductor chip including a plurality of logic elements;

the back-side insulating layer including a fence and a plurality of color filters in the pixel area, the fence having a grid pattern and the plurality of color filters separated from each other by the fence;

the peripheral area comprising a shield area and a shield outer area, the shield area surrounding the pixel area; and a fence insulating layer in the shield outer area, the fence insulating layer comprising a same material as the fence.

17. The image sensor of claim 16, wherein the back-side insulating layer includes a metal layer or the fence insulating layer in the shield area.

18. The image sensor of claim 16, wherein each of the fence and the fence insulating layer comprises a lower conductive layer and an upper insulating layer; and the back-side insulating layer comprises an AlO layer, a first HfOx layer, a tetraethyl orthosilicate (TEOS) layer, and a second HfOx layer, the AlO layer, the first HfOx layer, the TEOS layer, and the second HfOx layer being sequentially stacked.

19. The image sensor of claim 16, wherein each of the fence and the fence insulating layer comprises a single insulating layer;

the back-side insulating layer comprises an AlO layer, a $TiO_2$ layer, a tetraethyl orthosilicate (TEOS) layer, and an HfOx layer, the AlO layer, the $TiO_2$ layer, the TEOS layer, and the HfOx layer being sequentially stacked;

the $TiO_2$ layer is disconnected at a node separation portion of the back-side insulating layer; and the AlO layer, the TEOS layer, and the HfOx layer are continuously connected in the node separation portion.

20. The image sensor of claim 16, wherein the fence insulating layer in the shield outer area is on the back-side insulating layer; and the fence and the fence insulating layer have a same thickness from an upper surface of the back-side insulating layer.

* * * * *